(12) United States Patent
Jung et al.

(10) Patent No.: US 11,978,805 B2
(45) Date of Patent: *May 7, 2024

(54) SEMICONDUCTOR DEVICE

(71) Applicant: SAMSUNG ELECTRONICS CO., LTD., Suwon-si (KR)

(72) Inventors: Soonmoon Jung, Seongnam-si (KR); Daewon Ha, Seoul (KR); Sungmin Kim, Incheon (KR); Hyojin Kim, Seoul (KR); Keun Hwi Cho, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/110,961

(22) Filed: Feb. 17, 2023

(65) Prior Publication Data
US 2023/0197858 A1 Jun. 22, 2023

Related U.S. Application Data

(63) Continuation of application No. 17/240,616, filed on Apr. 26, 2021, now Pat. No. 11,588,054, which is a (Continued)

(30) Foreign Application Priority Data

Jul. 20, 2018 (KR) .................. 10-2018-0084807

(51) Int. Cl.
*H01L 29/786* (2006.01)
*H01L 29/66* (2006.01)
*H01L 29/78* (2006.01)

(52) U.S. Cl.
CPC .. *H01L 29/78645* (2013.01); *H01L 29/66484* (2013.01); *H01L 29/6675* (2013.01);
(Continued)

(58) Field of Classification Search
CPC ......... H01L 29/78645; H01L 29/66484; H01L 29/6675; H01L 29/66787; H01L 29/7827;
(Continued)

(56) References Cited

U.S. PATENT DOCUMENTS 5,372,959 A 12/1994 Chan
9,412,616 B1 8/2016 Xie et al.
(Continued)

FOREIGN PATENT DOCUMENTS

CN 104377197 2/2015
CN 107039431 8/2017
(Continued)

OTHER PUBLICATIONS

Notice of Allowance dated Sep. 22, 2022 From the Korean Patent Office Cited in Corresponding Korean Application.

*Primary Examiner* — Karen Kusumakar
*Assistant Examiner* — Adam S Bowen
(74) *Attorney, Agent, or Firm* — Fish & Richardson P.C.

(57) ABSTRACT

A semiconductor device includes first active patterns on a PMOSFET section of a logic cell region of a substrate, second active patterns on an NMOSFET section of the logic cell region, third active patterns on a memory cell region of the substrate, fourth active patterns between the third active patterns, and a device isolation layer that fills a plurality of first trenches and a plurality of second trenches. Each of the first trenches is interposed between the first active patterns and between the second active patterns. Each of the second trenches is interposed between the fourth active patterns and between the third and fourth active patterns. Each of the third and fourth active patterns includes first and second semiconductor patterns that are vertically spaced apart from each other. Depths of the second trenches are greater than depths of the first trenches.

20 Claims, 29 Drawing Sheets

Related U.S. Application Data continuation of application No. 16/504,960, filed on Jul. 8, 2019, now Pat. No. 11,004,981.

(52) U.S. Cl.
CPC .... H01L 29/66787 (2013.01); H01L 29/7827 (2013.01); H01L 29/78696 (2013.01)

(58) Field of Classification Search
CPC ......... H01L 29/78696; H01L 29/66545; H01L 27/0924; H01L 29/42392; H01L 29/7848; H01L 21/76224; H01L 27/0207; H01L 29/401; H01L 29/41791; H01L 29/4236; H01L 29/6656; H01L 29/7846; H10B 99/00; H10B 10/12

See application file for complete search history.

(56) References Cited

U.S. PATENT DOCUMENTS

| | | |
|---|---|---|
| 9,576,959 B1 | 2/2017 | Dong et al. |
| 9,691,471 B2 | 6/2017 | Liaw |
| 10,090,413 B2 | 10/2018 | Kim et al. |
| 10,177,150 B2 | 1/2019 | Yang et al. |
| 10,304,964 B2 | 5/2019 | Liang et al. |
| 10,546,946 B2 | 1/2020 | Shinohara |
| 11,037,926 B2 | 6/2021 | Suh et al. |
| 2013/0313513 A1 | 11/2013 | Cappellani et al. |
| 2014/0203370 A1 | 7/2014 | Maeda et al. |
| 2015/0004774 A1 | 1/2015 | Kang et al. |
| 2016/0111537 A1 | 4/2016 | Tsai et al. |
| 2016/0343709 A1 | 11/2016 | Kim et al. |
| 2017/0033217 A1 | 2/2017 | Hong et al. |
| 2017/0103986 A1 | 4/2017 | Kim et al. |
| 2017/0110372 A1 | 4/2017 | Baek et al. |
| 2017/0148727 A1* | 5/2017 | Do .................. H01L 23/5221 |
| 2017/0162574 A1 | 6/2017 | Kim et al. |
| 2017/0162583 A1 | 6/2017 | Lee et al. |
| 2017/0194143 A1 | 7/2017 | Balakrishnan et al. |
| 2017/0256611 A1 | 9/2017 | Kim et al. |
| 2017/0294437 A1 | 10/2017 | Cantoro et al. |
| 2017/0365604 A1 | 12/2017 | Suh et al. |

FOREIGN PATENT DOCUMENTS

| | | |
|---|---|---|
| CN | 107527911 | 12/2017 |
| JP | 2017152541 A | 8/2017 |
| KR | 101366742 B1 | 2/2014 |
| KR | 20170048666 A | 5/2017 |
| KR | 10-1772313 B1 | 8/2017 |

* cited by examiner

# SEMICONDUCTOR DEVICE

CROSS-REFERENCE TO RELATED APPLICATIONS

This is a Continuation of U.S. application Ser. No. 17/240,616, filed Apr. 26, 2021, now U.S. Pat. No. 11,588,043, issued Feb. 21, 2023, which is a Continuation of U.S. application Ser. No. 16/504,960, filed Jul. 8, 2021, now U.S. Pat. No. 11,004,981, issued May 11, 2021, and a claim of priority under 35 U.S.C § 119 is made to Korean Patent Application No. 10-2018-0084807 filed on Jul. 20, 2018 in the Korean Intellectual Property Office, the entire contents of which are hereby incorporated by reference.

BACKGROUND

The present inventive concepts relate to a semiconductor device, and more particularly, to a semiconductor device including a gate-all-around type transistor in a memory cell region.

Semiconductor devices are beneficial in the electronics industry because of their small size, multi-functionality, and/or low fabrication cost. Semiconductor devices include memory devices for storing data, logic devices for processing data, and hybrid semiconductor devices having both memory and logic elements and their associated functions. Increasing the reliability, speed, capacity and/or functionality of such semiconductor devices is required for advancing the electronics industry. To meet these requested characteristics, semiconductor devices are gradually becoming more highly integrated and hence, more complex. However, it is becoming increasingly difficult to keep up with the growing demand for increasing the degree to which semiconductor devices are integrated.

SUMMARY

According to an aspect of the present inventive concepts, there is provided a semiconductor device comprising: a substrate having a plurality of first active patterns, a plurality of second active patterns, a plurality of third active patterns, and a plurality of fourth active patterns, and a device isolation layer, and in which the plurality of first active patterns being located in a PMOSFET section of a logic cell region of the semiconductor device, the plurality of second active patterns being located in in an NMOSFET section of the logic cell region, the plurality of third active patterns in a memory cell region of the semiconductor device, the plurality of fourth active patterns being located in between respective ones of the third active patterns, the active patterns of the substrate define a plurality of logic region trenches and a plurality of memory cell region trenches, the logic region trenches are located between adjacent ones of the first active patterns and between adjacent ones of the second active patterns, respectively, the memory cell region trenches are located between adjacent ones of the fourth active patterns and between said respective ones of the third active patterns and the fourth active patterns adjacent thereto, respectively, the device isolation layer is disposed in the plurality of logic region trenches and in the plurality of memory cell region trenches, each of the third and fourth active patterns includes first and second semiconductor patterns that are vertically spaced apart from each other, and the memory cell region trenches are deeper than the logic region trenches.

According to another aspect of the present inventive concepts, there is provided a semiconductor device comprising: a substrate having a plurality of first active patterns, a plurality of second active patterns, a plurality of third active patterns, and a plurality of fourth active patterns, and a first device isolation layer, and in which the plurality of first active patterns are located in a PMOSFET section of a first region of the semiconductor device, the plurality of second active patterns are located in an NMOSFET section of the first region, the plurality of third active patterns are located in a second region of the semiconductor device disposed laterally of the first region, the plurality of fourth active patterns are located in between respective ones of the third active patterns, the substrate defines a plurality of first region trenches and a plurality of second region trenches, the first region trenches are located between adjacent ones of the first active patterns and between adjacent ones of the second active patterns, respectively, the second region trenches are located between adjacent ones of the fourth active patterns and between said respective ones of the third active patterns and the fourth active patterns adjacent thereto, respectively; the first device isolation layer is disposed in the plurality of first region trenches and in the plurality of second region trenches, each of the third and fourth active patterns includes first and second semiconductor patterns that are vertically spaced apart from each other, and maximum heights of the third and fourth active patterns are greater than maximum heights of the first and second active patterns.

According to still another aspect of the present inventive concepts, there is provided a semiconductor device comprising: a substrate having a plurality of first active patterns, a plurality of second active patterns, a plurality of third active patterns, and a plurality of fourth active patterns, and a first device isolation layer, and in which the plurality of first active patterns are located in a PMOSFET section of a first region of the semiconductor device, the plurality of second active patterns are located in an NMOSFET section of the first region, the plurality of third active patterns are located in a second region of the semiconductor device disposed laterally of the first region, the plurality of fourth active patterns are located in between respective ones of the third active patterns, the substrate defines a plurality of first region trenches and a plurality of second region trenches, the first region trenches are located between adjacent ones of the first active patterns and between adjacent ones of the second active patterns, respectively, the second region trenches are located between adjacent ones of the fourth active patterns and between said respective ones of the third active patterns and the fourth active patterns adjacent thereto, respectively, the first device isolation layer is disposed in the plurality of first region trenches and in the plurality of second region trenches, and each of the third and fourth active patterns includes first, second, third and fourth semiconductor patterns that are vertically spaced apart from each other.

DETAILED DESCRIPTION

Figure 1A:
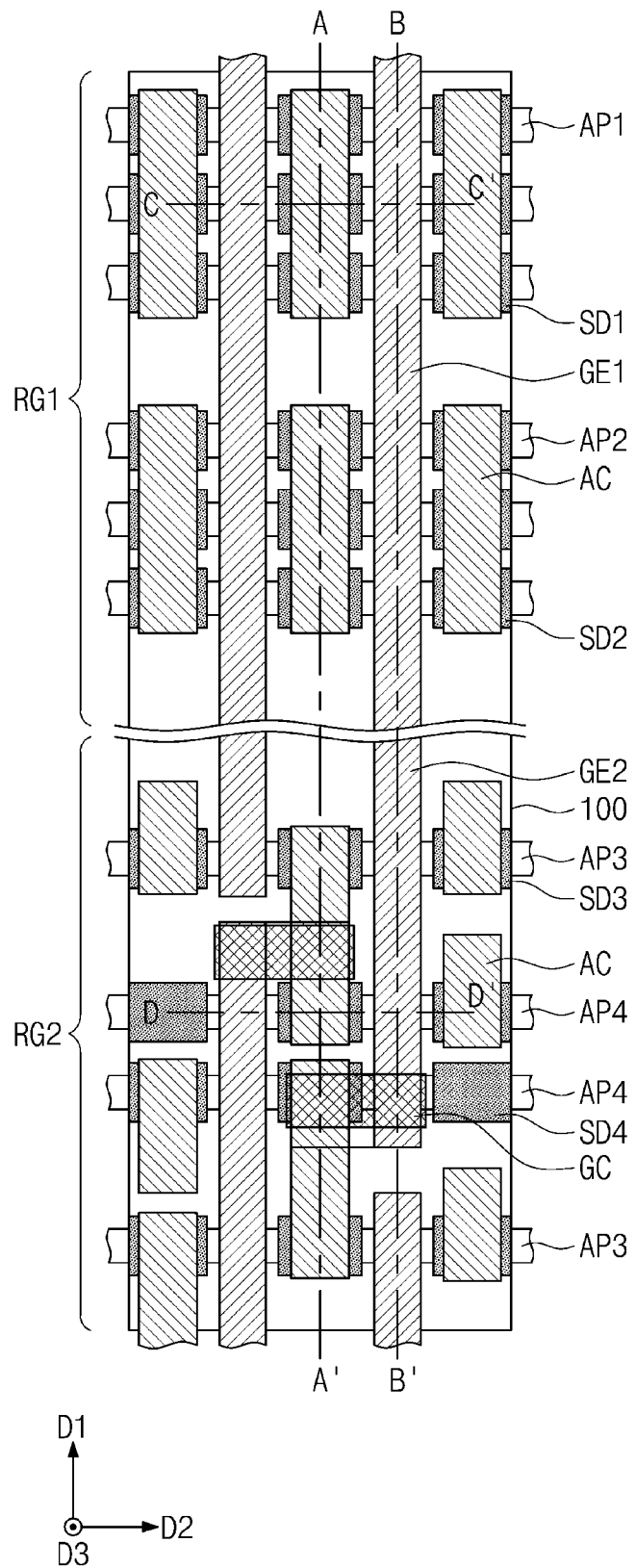
FIG. 1A is a plan view, in schematic form, of examples of a semiconductor device according to the present inventive concepts.
Figure 1B:
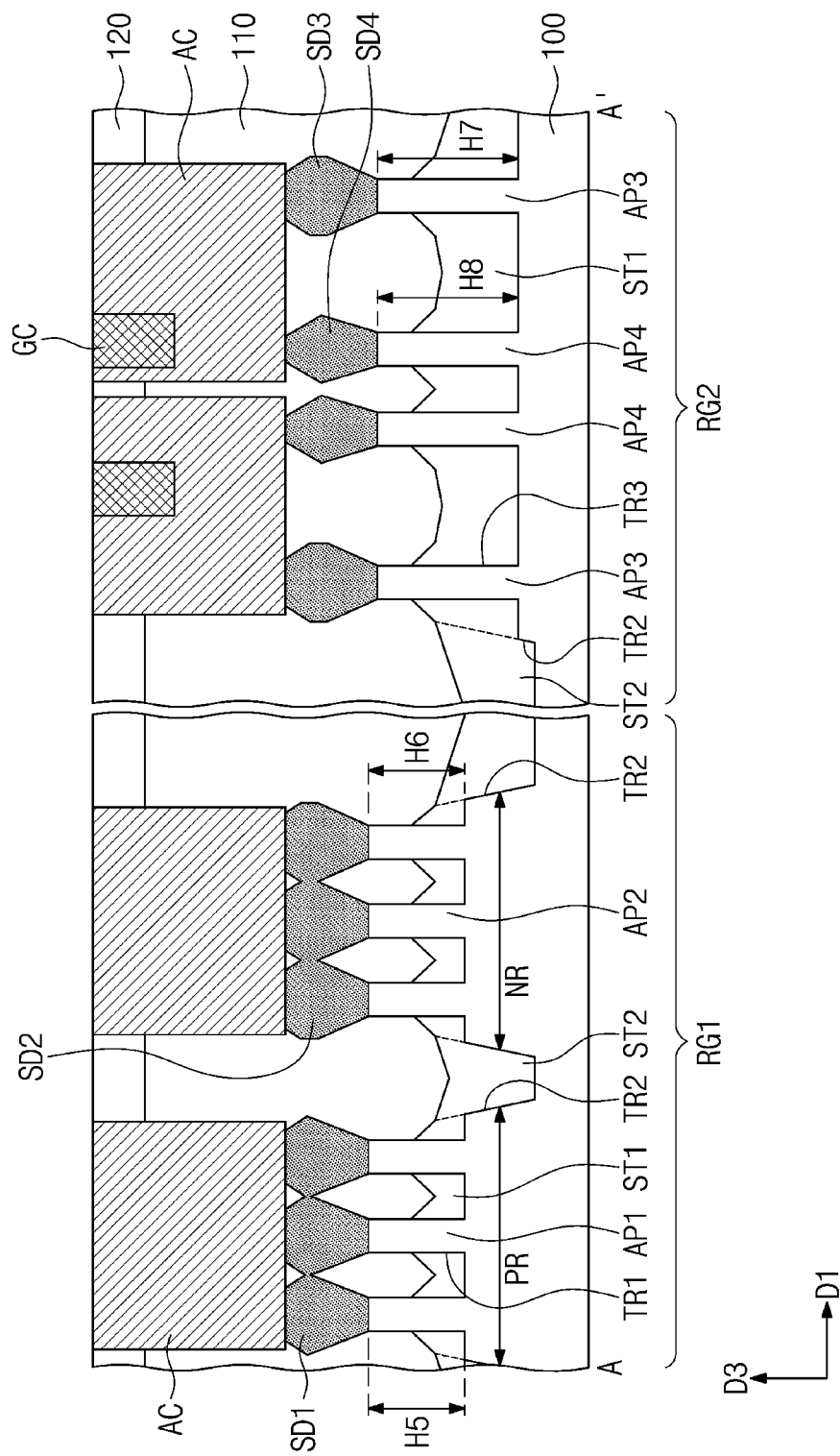
FIGS. 1B, 1C, 1D and 1E are cross-sectional views of an example of a semiconductor device having the layout shown in FIG. 1A according to the present inventive concepts, and respectively taken in directions corresponding to lines A-A', B-B', C-C', and D-D' of FIG. 1A.
Figure 1C:
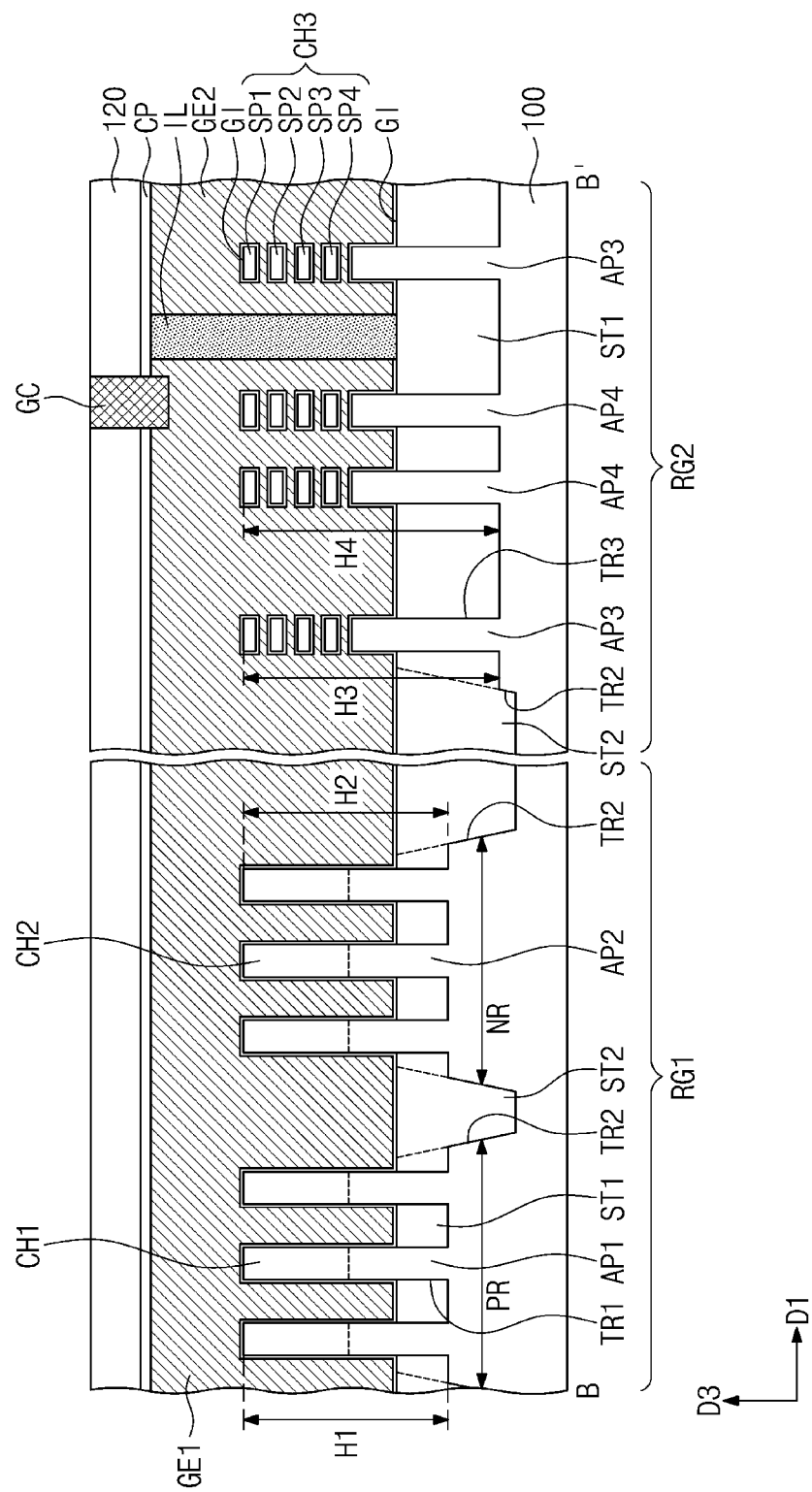
Figure 1D:
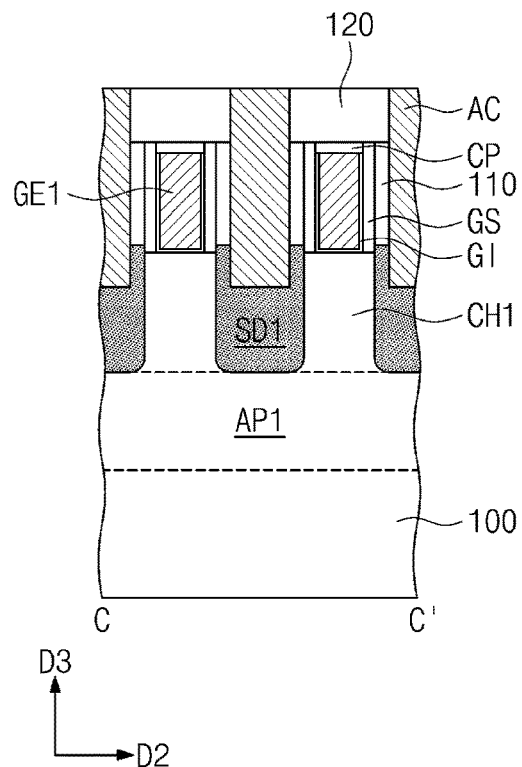
Figure 1E:
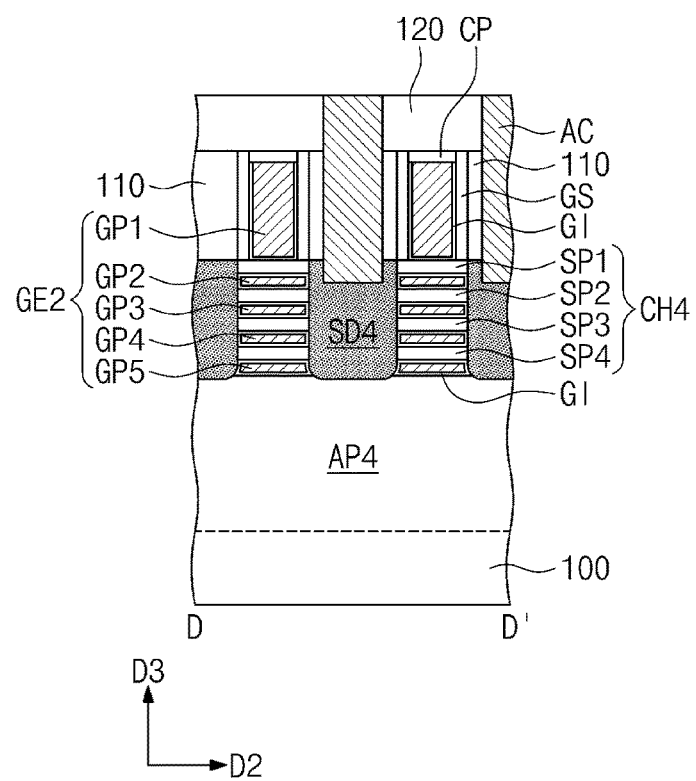

An example of a semiconductor device according to the present inventive concepts will now be described in detail with reference to FIGS. 1A-1E.

The semiconductor device has a substrate 100 in a first region RG1 and a second region RG2 of the device. The substrate 100 may be a semiconductor substrate. For example, the substrate 100 may be a silicon substrate, a germanium substrate, or a silicon-on-insulator (SOI) substrate.

The first region RG1 may be a logic cell region in which logic transistors are disposed to constitute a logic circuit of the semiconductor device. For example, the logic cell region may be provided with logic transistors constituting a processor core or an I/O terminal. The first region RG1 may include first and second transistors having different conductivity types from each other. In this respect, the first region RG1 may include a PMOSFET section PR and an NMOSFET section NR. Thus, for example, the first transistors may be PMOSFETs in the PMOSFET section, and the second transistors may be NMOSFETs in the NMOSFET section NR.

The second region RG2 of the substrate 100 may be a memory cell region where memory cells are formed to store data. For example, the memory cell region of the substrate 100 may be provided with memory cell transistors that constitute a plurality of SRAM cells. The memory cell transistors may be gate-all-round type transistors. The gate-all-around type transistor may include a gate electrode that surrounds top and bottom surfaces and opposite sidewalls of a channel.

First and second device isolation layers ST1 and ST2 may be provided in the substrate 100. The first and second device isolation layers ST1 and ST2 may be interposed between first active patterns AP1 on the PMOSFET section PR of the substrate 100 in the first region RG1, between second active patterns AP2 on the NMOSFET section NR of the substrate 100 in the first region RG1, and between third and fourth active patterns AP3 and AP4 in the second region RG2. Each of the first to fourth active patterns AP1 to AP4 may have a linear or bar shape extending in a second direction D2 parallel to a top surface of the substrate 100. The fourth active patterns AP4 may be interposed between the third active patterns AP3. A distance in a first direction D1 between the fourth active patterns AP4, i.e., the spacing of the fourth active patterns AP4, may be less than the distance in the first direction D1 between neighboring third and fourth active patterns AP3 and AP4. The first direction D1 may intersect the second direction D2.

First trenches TR1 (first region or logic trenches) may be defined between neighboring first active patterns AP1 and between neighboring second active patterns AP2. Second trenches TR2 may be defined between neighboring first and second active patterns AP1 and AP2 and between neighboring second and third active patterns AP2 and AP3. One of the second trenches TR2 (a second first region trench) may separate the PMOSFET section PR and the NMOSFET section NR from each other in the first direction D1. The second trenches TR2 may be deeper than the first trenches TR1. Thus, the second trenches TR2 may have bottoms at a level lower than that of the bottoms of the first trenches TR1.

Third trenches TR3 (e.g., second or memory cell region trenches) may be defined between neighboring third and fourth active patterns AP3 and AP4 and between neighboring fourth active patterns AP4. The third trenches TR3 may be deeper than the first trenches TR1. Thus, the third trenches TR3 may have bottoms at a level lower than that of the bottoms of the first trenches TR1. The third trenches TR3 may extend to a depth in the substrate 100 shallower than the depth to which the second trenches TR2 extend. Thus, the bottoms of the third trenches TR3 may be located at a level higher than that of the bottoms of the second trench TR2.

The first device isolation layer ST1 may fill the first and third trenches TR1 and TR3. The second device isolation layer ST2 may fill the second trench TR2. The second device isolation layer ST2 may extend more deeply into the device than the first device isolation layer ST1. Thus, the second device isolation layer ST2 may have a thickness greater than that of the first device isolation layer ST1 and may have a bottom surface at a level lower than that of a bottom surface of the first device isolation layer ST1. Upper portions of the first to fourth active patterns AP1 to AP4 may vertically protrude beyond the first and second device isolation layers ST1 and ST2. Each of the upper portions of the first to fourth active patterns AP1 to AP4 may form a fin that vertically protrudes above the first and second device isolation layers ST1 and ST2. The first and second device isolation layers ST1 and ST2 may include a dielectric material (e.g., silicon oxide). The first and second device isolation layers ST1 and ST2 may be integral and together may constitute a single (contiguous) device isolation layer.

First source/drain patterns SD1 may be provided on the first active patterns AP1. Second source/drain patterns SD2 may be provided on the second active patterns AP2. The first source/drain patterns SD1 may be p-type impurity regions. The second source/drain patterns SD2 may be n-type impurity regions. The first source/drain patterns SD1 may be disposed on opposite ends of first channels CH1 at an upper portion of the first active pattern AP1, and the second source/drain patterns SD2 may be disposed on opposite ends of second channels CH2 at an upper portion of the second active pattern AP2. More specifically, each of the first channels CH1 may be interposed between neighboring ones of a pair of first source/drain patterns SD1, and each of the second channels CH2 may be interposed between neighboring ones of a pair of second source/drain patterns SD2.

Third source/drain patterns SD3 may be provided on the third active patterns AP3. Fourth source/drain patterns SD4 may be provided on the fourth active patterns AP4. The third source/drain patterns SD3 may be n-type impurity regions. The fourth source/drain patterns SD4 may be p-type impurity regions. The third source/drain patterns SD3 may be disposed on opposite ends of third channels CH3 at an upper portion of the third active pattern AP3, and the fourth source/drain patterns SD4 may be disposed on opposite ends of fourth channels CH4 at an upper portion of the fourth active pattern AP4. More specifically, each of the third channels CH3 may be interposed between neighboring ones of a pair of third source/drain patterns SD3, and each of the fourth channels CH4 may be interposed between neighboring ones of a pair of fourth source/drain patterns SD4.

Each of the third and fourth channels CH3 and CH4 may include first to fourth semiconductor patterns SP1 to SP4 that are sequentially stacked. The first to fourth semiconductor patterns SP1 to SP4 may be spaced apart from each other in a third direction D3 perpendicular to the top surface of the substrate 100. The first to fourth semiconductor patterns SP1 to SP4 may be vertically juxtaposed. Each of the third source/drain patterns SD3 may directly contact a side of each of the first to fourth semiconductor patterns SP1 to SP4. Each of the fourth source/drain patterns SD4 may directly contact a side of each of the first to fourth semiconductor patterns SP1 to SP4. Thus, the first to fourth semiconductor patterns SP1 to SP4 may connect neighboring ones of a pair of third source/drain patterns SD3 to each other, and also connect neighboring ones of a pair of fourth source/drain patterns SD4 to each other.

The first to fourth semiconductor patterns SP1 to SP4 may have the same or different thicknesses. The first to fourth semiconductor patterns SP1 to SP4 may have the same or different maximum lengths in the second direction D2.

The first to fourth semiconductor patterns SP1 to SP4 may include one or more of silicon (Si), germanium (Ge), silicon-germanium (SiGe), and a III-V group compound (e.g., gallium-arsenic). Although each of the third and fourth channels CH3 and CH4 is illustrated to include four semiconductor patterns, namely, the first to fourth semiconductor patterns SP1 to SP4, the number of semiconductor patterns is not particularly limited.

The first active pattern AP1 may have a first height H1 as its maximum height. The first height H1 may be the shortest distance from the bottom of the first trench TR1 to a top surface of the first channel CH1. The first active pattern AP1 extends contiguously from an upper surface of the substrate 100 defining the bottom of the first trench TR1 to the top surface of the first channel CH1. The second active pattern AP2 may have a second height H2 as its maximum height. The second height H2 may be the shortest distance from the bottom of the first trench TR1 to a top surface of the second channel CH2. The second active pattern AP2 extends contiguously from an upper surface of the substrate 100 defining the bottom of the first trench TR1 to the top surface of the first channel CH2. The third active pattern AP3 may have a third height H3 as its maximum height. The third height H3 may be the shortest distance from the bottom of the third trench TR3 to a top surface of the first semiconductor pattern SP1 of the third channel CH3. The fourth active pattern AP4 may have a fourth height H4 as its maximum height. The fourth height H4 may be the shortest distance from the bottom of the third trench TR3 to a top surface of the first semiconductor pattern SP1 of the fourth channel CH4.

The first and second heights H1 and H2 may be substantially the same and may correspond to the depth of the first trench TR1. The third and fourth heights H3 and H4 may be substantially the same and may correspond to the depth of the third trench TR3. The third and fourth heights H3 and H4 may be greater than the first and second heights H1 and H2.

A portion of the first active pattern AP1 beneath the first source/drain pattern SD1 may have a fifth height H5. The fifth height H5 may be the shortest distance from the bottom of the first trench TR1 to a bottom of the first source/drain pattern SD1. A portion of the second active pattern AP2 beneath the second source/drain pattern SD2 may have a sixth height H6. The sixth height H6 may be the shortest distance from the bottom of the first trench TR1 to a bottom of the second source/drain pattern SD2. A portion of the third active pattern AP3 beneath the third source/drain pattern SD3 may have a seventh height H7. The seventh height H7 may be the shortest distance from the bottom of the third trench TR3 to a bottom of the third source/drain pattern SD3. A portion of the fourth active pattern AP4 beneath the fourth source/drain pattern SD4 may have an eighth height H8. The eighth height H8 may be the shortest distance from the bottom of the third trench TR3 to a bottom of the fourth source/drain pattern SD4.

The fifth and sixth heights H5 and H6 may be substantially the same, and the seventh and eighth heights H7 and H8 may be substantially the same. The seventh and eighth heights H7 and H8 may be greater than the fifth and sixth heights H5 and H6.

Each of the first source/drain patterns SD1 may be an epitaxial pattern that is formed using the first channel CH1 and the first active pattern AP1 as a seed layer. The first source/drain patterns SD1 may include a material that provides the first channel CH1 with compressive stress. For example, the first source/drain patterns SD1 may include a semiconductor element (e.g., silicon-germanium) whose lattice constant is greater than that of a semiconductor element of the substrate 100.

Each of the second source/drain patterns SD2 may be an epitaxial pattern that is formed using the second channel CH2 and the second active pattern AP2 as a seed layer. For example, the second source/drain patterns SD2 may include a semiconductor element whose lattice constant is less than that of a semiconductor element of the substrate 100. As another example, the second source/drain patterns SD2 includes the same semiconductor element (e.g., silicon) as that of the substrate 100.

Each of the third source/drain patterns SD3 may be an epitaxial pattern that is formed using the third active pattern AP3 and the first to fourth semiconductor patterns SP1 to SP4 of the third channel CH3 as a seed layer. For example, the third source/drain patterns SD3 may include a semiconductor element whose lattice constant is less than that of a semiconductor element of the substrate 100. As another example, the third source/drain patterns SD3 includes the same semiconductor element (e.g., silicon) as that of the substrate 100.

Each of the fourth source/drain patterns SD4 may be an epitaxial pattern that is formed using the fourth active pattern AP4 and the first to fourth semiconductor patterns SP1 to SP4 of the fourth channel CH4 as a seed layer. The fourth source/drain patterns SD4 may include a material that provides the fourth channel CH4 with compressive stress. For example, the fourth source/drain patterns SD4 may include a semiconductor element (e.g., silicon-germanium) whose lattice constant is greater than that of a semiconductor element of the substrate 100.

The first region RG1 may be provided with first gate electrodes GE1 that extend in the first direction D1 and run across the first and second channels CH1 and CH2. The second region RG2 may be provided with second gate electrodes GE1 that extend in the first direction D1 and run across the third and fourth channels CH3 and CH4. The first gate electrodes GE1 may be spaced apart from each other in the second direction D2, and the second gate electrodes GE2 may be spaced apart from each other in the second direction D2. The first gate electrodes GE1 may overlap the first and second channels CH1 and CH2, and the second gate electrodes GE2 may overlap the third and fourth channels CH3 and CH4. Furthermore, the first and second gate electrodes GE1 and GE2 may include one or more materials selected from the group consisting of conductive metal nitrides (e.g., titanium nitride or tantalum nitride), metals (e.g., titanium, tantalum, tungsten, copper, or aluminum), and conductive metal carbides (e.g., titanium carbide or tungsten carbide).

The second gate electrode GE2 may surround each of the first to fourth semiconductor patterns SP1 to SP4 of the third and fourth channels CH3 and CH4. For example, the second gate electrode GE2 may surround top and bottom surfaces and opposite side surfaces of each of the first to fourth semiconductor patterns SP1 to SP4.

The second gate electrode GE2 may include first to fifth segments GP1 to GP5. The first segment GP1 may be provided on the first semiconductor pattern SP1, the second segment GP2 may be interposed between the first semiconductor pattern SP1 and the second semiconductor pattern SP2, the third segment GP3 may be interposed between the second semiconductor pattern SP2 and the third semiconductor pattern SP3, the fourth segment GP4 may be interposed between the third semiconductor pattern SP3 and the fourth semiconductor pattern SP4, and the fifth segment GP5 may be provided beneath the fourth semiconductor pattern SP4.

A dielectric pattern IL may be provided on the substrate 100 in the second region RG2 of the device. The dielectric pattern IL may be interposed between the second gate electrodes GE2. The dielectric pattern IL may separate the second gate electrodes GE2 from each other.

A pair of gate spacers GS may be disposed on opposite sides of each of the first and second gate electrodes GE1 and GE2. The gate spacers GS may extend in the first direction D1 along the first and second gate electrodes GE1 and GE2. The gate spacers GS may have their top surfaces higher than those of the first and second gate electrodes GE1 and GE2. The top surfaces of the gate spacers GS may be coplanar with that of a first interlayer dielectric layer 110 which will be discussed below. The gate spacers GS may include one or more of $SiO_2$, SiCN, SiCON, and SiN. As other examples, the gate spacers GS each include two or more layers different materials selected from the group consisting of $SiO_2$, SiCN, SiCON, and SiN.

A gate dielectric pattern GI may be interposed between each of the first and second gate electrodes GE1 and GE2 and each of the first to fourth channels CH1 to CH4. The gate dielectric pattern GI may be interposed between the second gate electrode GE2 and each of the first to fourth semiconductor patterns SP1 to SP4. The gate dielectric patterns GI may be interposed between the third source/drain patterns SD3 and the second to fifth segments GP2 to GP5. The gate dielectric patterns GI may contact the third source/drain patterns SD3. The gate dielectric patterns GI may be interposed between the fourth source/drain patterns SD4 and the second to fifth segments GP2 to GP5. The gate dielectric patterns GI may contact the fourth source/drain patterns SD4. The gate dielectric pattern GI may include high-k dielectric material. For example, the high-k dielectric material may include one or more high-k dielectric materials selected from the group consisting of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

A gate capping pattern GP may be provided on each of the first and second gate electrodes GE1 and GE2. The gate capping pattern GP may extend in the first direction D1 along the first and second gate electrodes GE1 and GE2. The gate capping pattern GP may include a material having an etch selectivity with respect to first and second interlayer dielectric layers 110 and 120 which will be discussed below. For example, the gate capping pattern CP may include one or more of SiON, SiCN, SiCON, and SiN.

A first interlayer dielectric layer 110 may be provided on an entire surface of the substrate 100. The first interlayer dielectric layer 110 may cover the first and second device isolation layers ST1 and ST2, the first and second gate electrodes GE1 and GE2, and the first to fourth source/drain patterns SD1 to SD4. The first interlayer dielectric layer 110 may have a top surface substantially coplanar with those of the gate capping patterns CP. A second interlayer dielectric layer 120 may be provided on the first interlayer dielectric layer 110. The first and second interlayer dielectric layers 110 and 120 may include a silicon oxide layer or a silicon oxynitride layer.

Active contacts AC may extend through the first and second interlayer dielectric layers 110 and 120 and connect with the first to fourth source/drain patterns SD1 to SD4. The active contacts AC may have their top surfaces coplanar with that of the second interlayer dielectric layer 120. The active contacts AC may include one or more materials selected from the group consisting of metals (e.g., may include titanium, tantalum, tungsten, copper, or aluminum) and conductive metal carbides (e.g., may include titanium carbide or tungsten carbide).

Gate contacts GC may be provided on the second gate electrodes GE2. Each of the gate contacts GC may extend through the second interlayer dielectric layer 120 and the gate capping pattern CP and may be coupled to the second gate electrode GE2. The gate contacts GC may have their top surfaces coplanar with that of the second interlayer dielectric layer 120. The gate contacts GC may have their bottom surfaces higher than those of the active contacts AC.

The gate contacts GC may include one or more materials selected from the group consisting of conductive metal nitrides (e.g., may include titanium nitride or tantalum nitride) and metals (e.g., may include titanium, tantalum, tungsten, copper, or aluminum). The gate contacts GC may include the same material as that of the active contacts AC. In any case, the gate contact GC and its connected active contact AC may constitute a single conductive structure.

FIGS. 2A to 8E illustrate an example of a method of fabricating a semiconductor device according to the present inventive concepts.

Figure 2A:
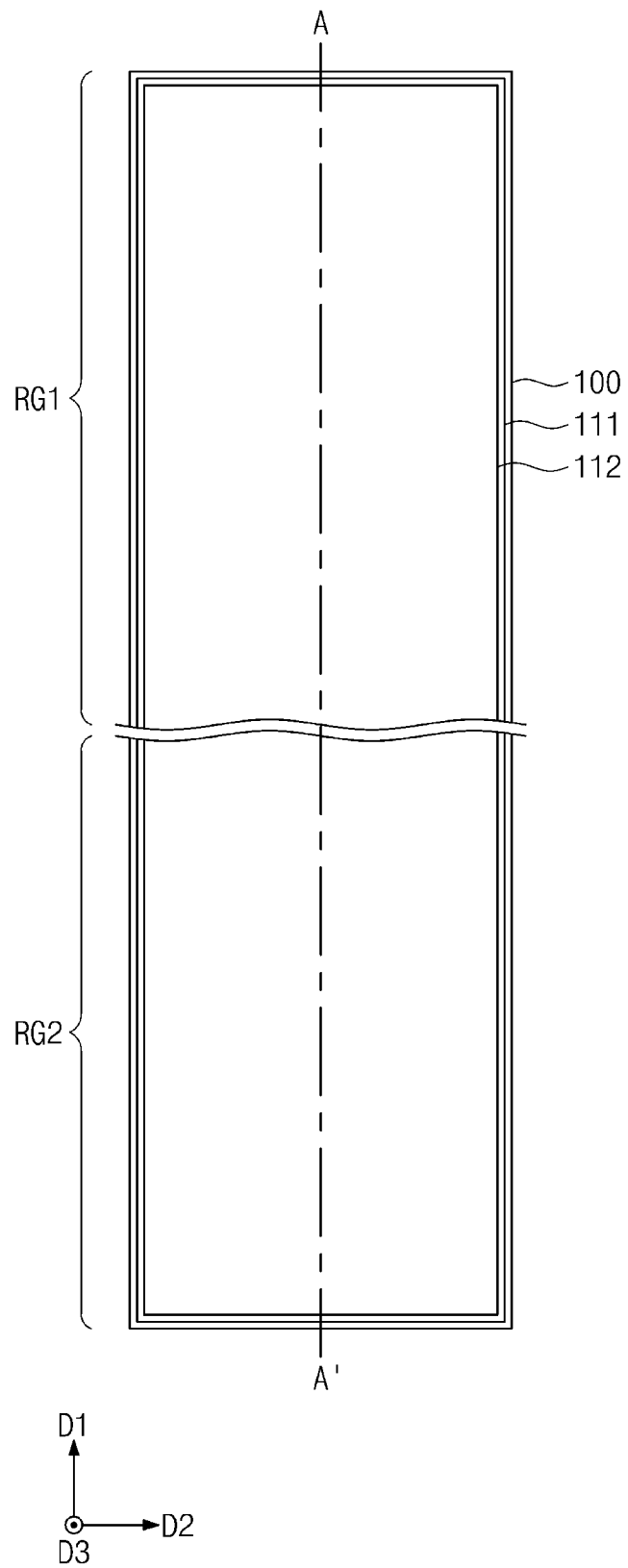
FIGS. 2A, 3A, 4A, 5A, 6A, 7A and 8A are plan views of a semiconductor device during the course of its manufacture according to the present inventive concepts.
Figure 2B:
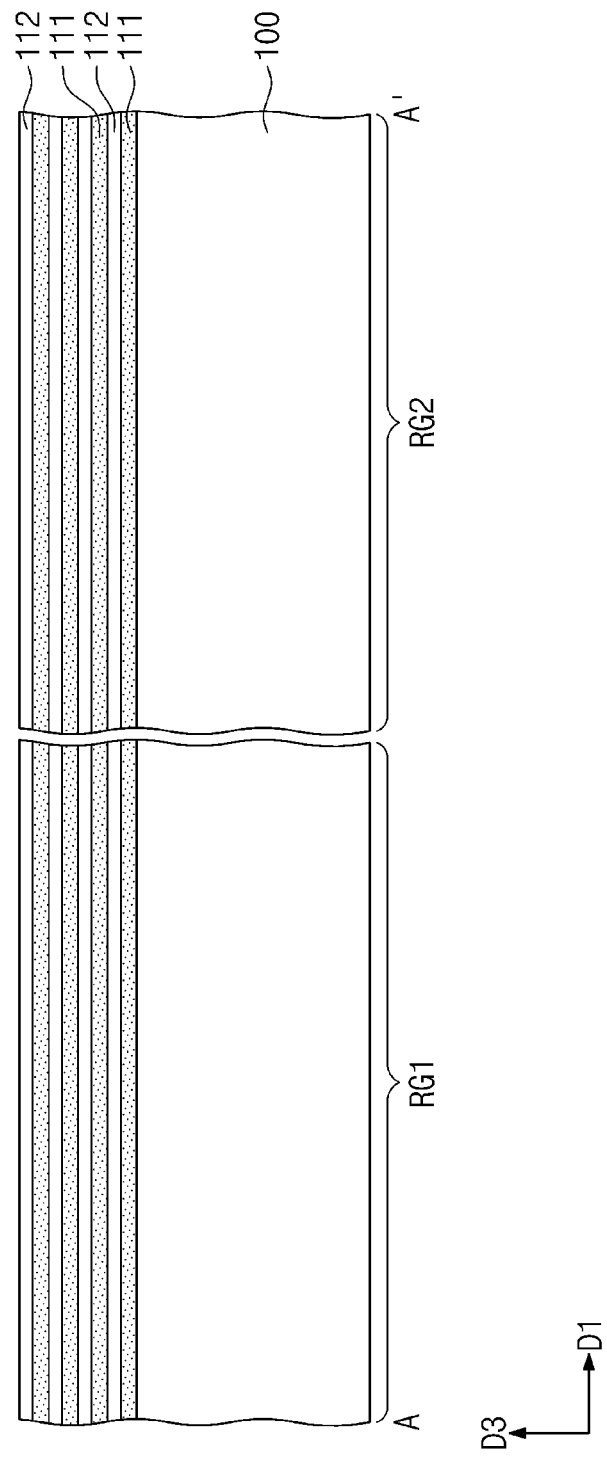
FIGS. 2B, 3B, 4B, 5B, 6B, 7B and 8B are cross-sectional views of the semiconductor device during the course of its manufacture as taken along lines A-A' of FIGS. 2A, 3A, 4A, 5A, 6A, 7A and 8A, respectively.

Referring to FIGS. 2A and 2B, sacrificial layers 111 and first semiconductor layers 112 may be alternately and repeatedly stacked on a surface of a substrate 100 across a first region RG1 and a second region RG2. The first semiconductor layers 112 may be repeatedly stacked four times, but the present inventive concepts are not limited thereto. The sacrificial layers 111 may include a material having an etch selectivity with respect to the first semiconductor layers 112. That is, the first semiconductor layers 112 may include a material that is not substantially etched in a process in which the sacrificial layers 111 are etched. For example, the sacrificial layers 111 may include silicon-germanium (SiGe) or germanium (Ge), and the first semiconductor layers 112 may include silicon (Si). In certain examples, in a process in which the sacrificial layers 111 are etched, etch rate ratios of the sacrificial layers 111 to the first semiconductor layers 112 are in a range of about 10:1 to about 200:1.

The sacrificial layers 111 and the first semiconductor layers 112 may be formed by an epitaxial growth process in which the substrate 100 is used as a seed layer. The sacrificial layers 111 and the first semiconductor layers 112 may be successively formed in the same chamber. The sacrificial layers 111 and the first semiconductor layers 112 may be conformally grown on the entire surface of the substrate 100.

Figure 3A:
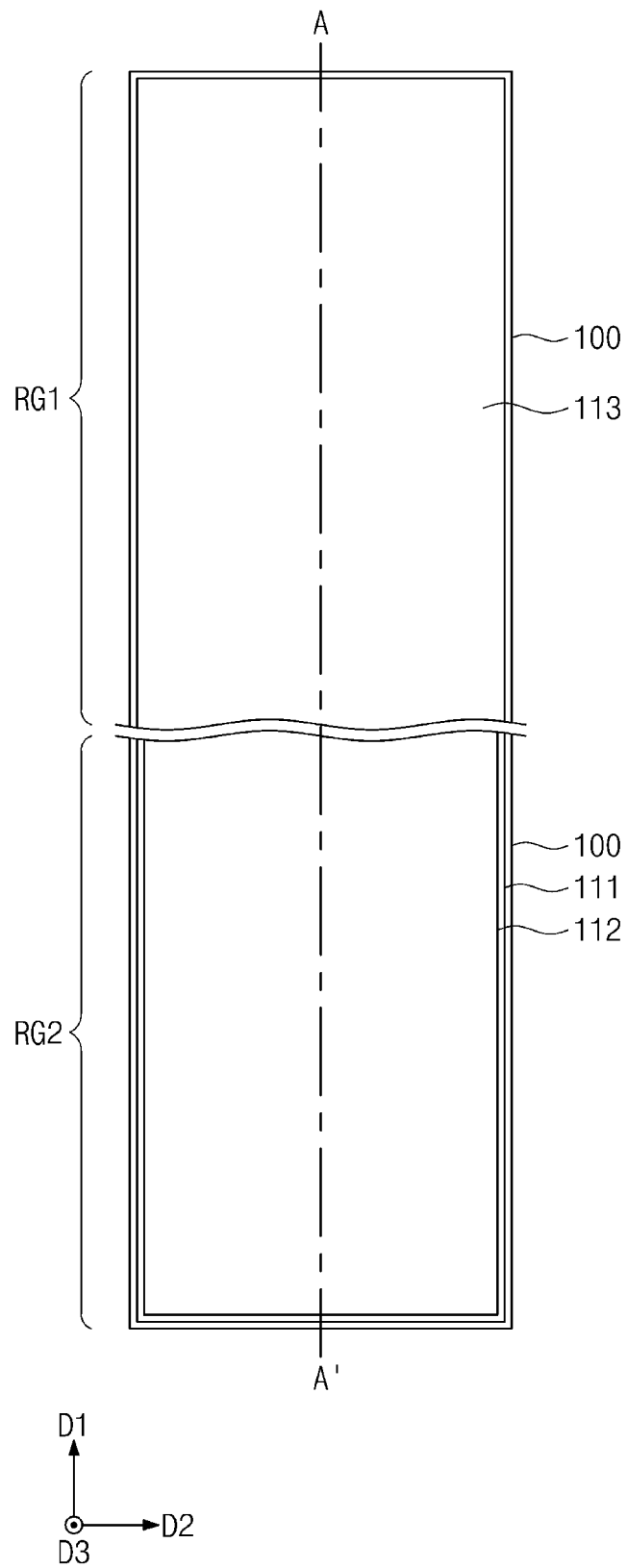
Figure 3B:
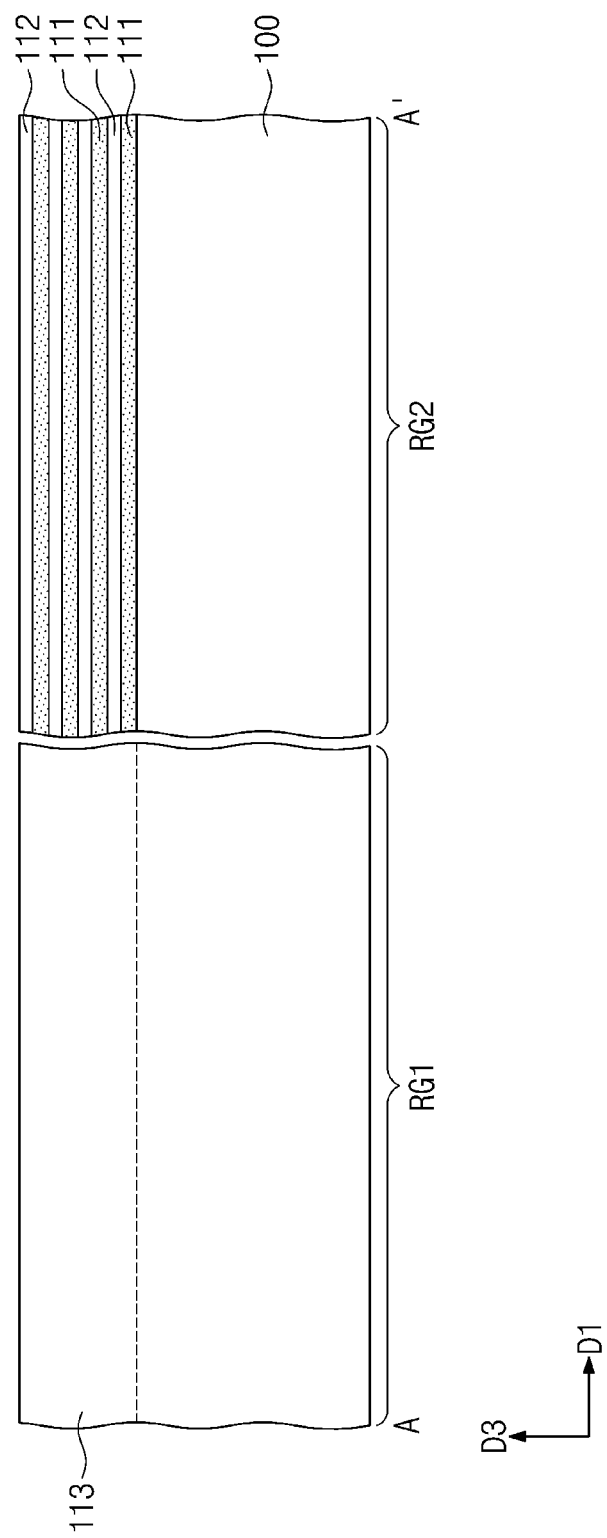

Referring to FIGS. 3A and 3B, a second semiconductor layer 113 may be formed on the substrate 100 in the first region RG1. The forming of the second semiconductor layer 113 may include removing the sacrificial layers 111 and the first semiconductor layers 112 from the first region RG1, and forming the second semiconductor layer 113 at a location from which the sacrificial layers 111 and the first semiconductor layers 112 have been removed. The second semiconductor layer 113 may be formed by an epitaxial growth process in which the substrate 100 is used as a seed layer. The second semiconductor layer 113 may include the same material as that of the first semiconductor layer 112. The second semiconductor layer 113 may have a top surface at substantially the same level as that of a top surface of an uppermost one of the first semiconductor layers 112 on the second region RG2.

Figure 4A:
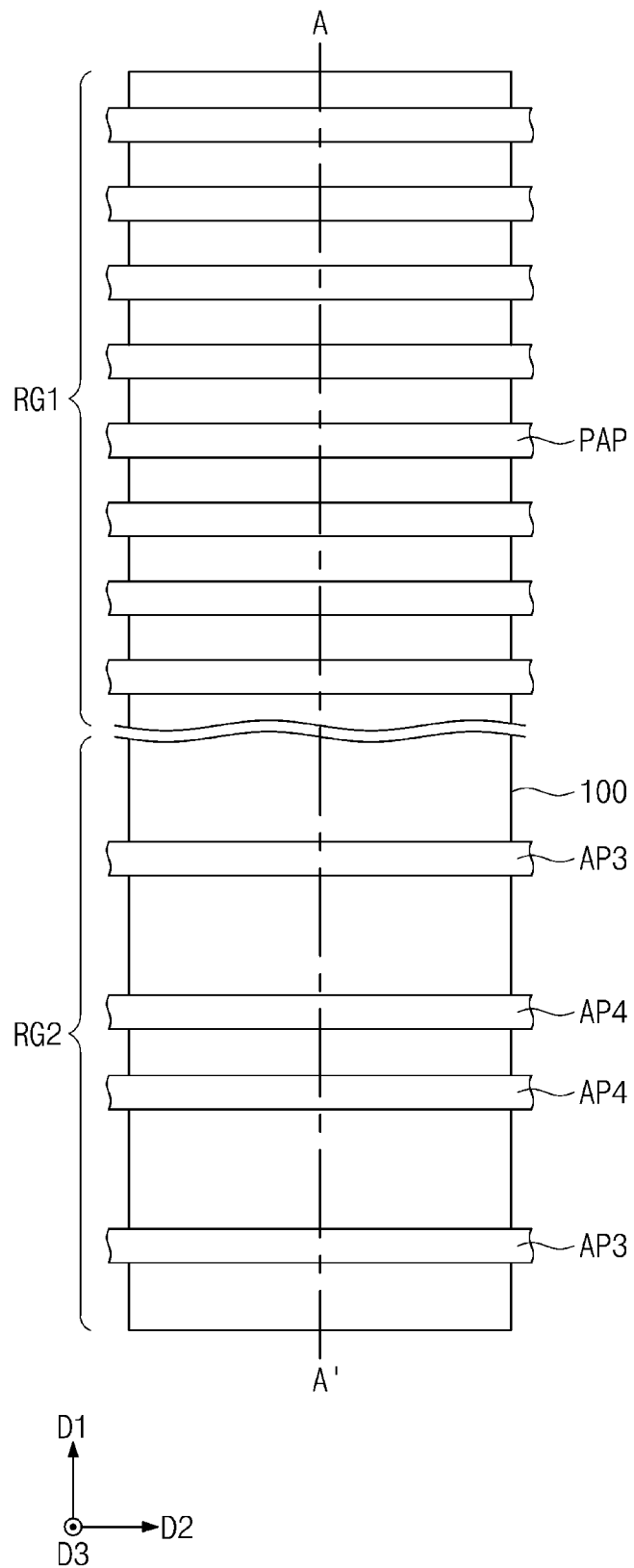
Figure 4B:
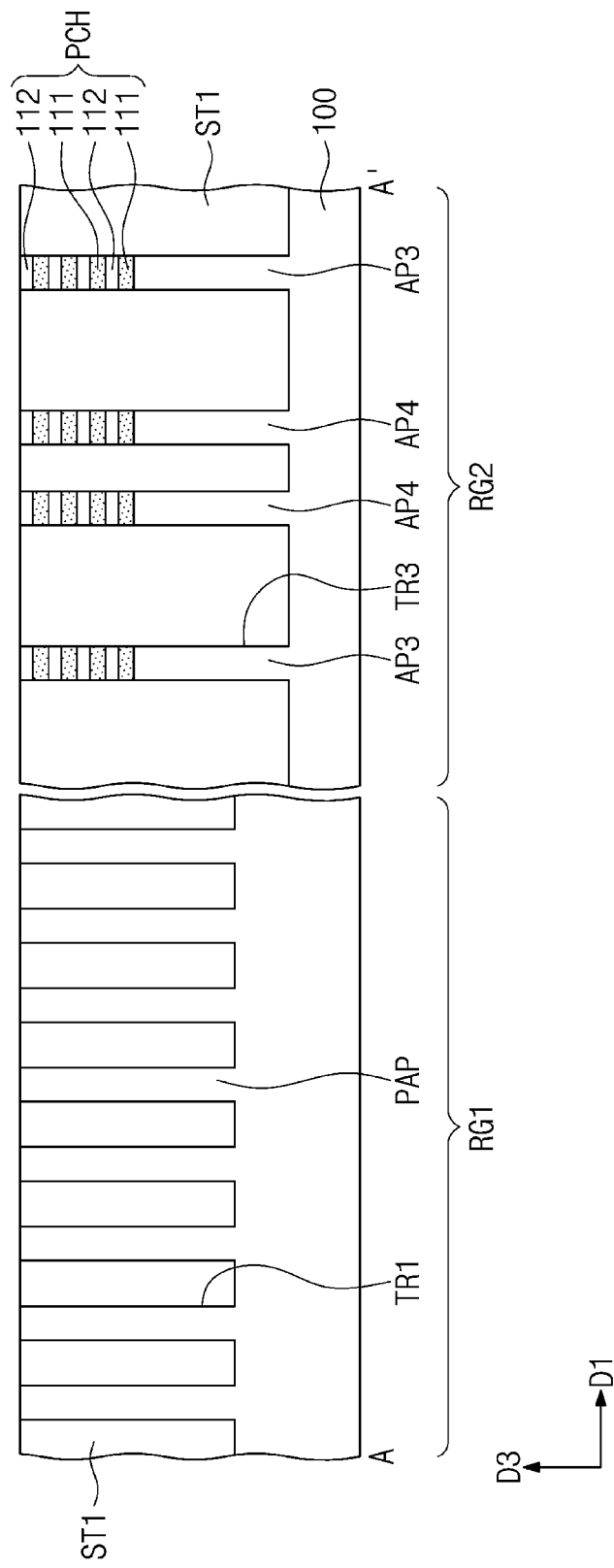

Referring to FIGS. 4A and 4B, a first patterning process may be performed to pattern the sacrificial layers 111, the first semiconductor layers 112, the second semiconductor layer 113, and the substrate 100. The first patterning process may form preliminary active patterns PAP in the first region RG1 and also form third and fourth active patterns AP3 and SAP4 in the second region RG2. Each of the third and fourth active patterns AP3 and AP4 may include a preliminary channel pattern PCH. The preliminary channel pattern PCH may include the patterned sacrificial layers 111 and the patterned first semiconductor layers 112.

The first patterning process may form a first trench TR1 between neighboring preliminary active patterns PAP. The first patterning process may also form a third trench TR3 between neighboring fourth active patterns AP4 and between neighboring third and fourth active patterns AP3 and AP4.

For example, the first patterning process may include simultaneously patterning the substrate 100 in the first and second regions RG1 and RG2 to form trenches having the same depth in the first and second regions RG1 and RG2, and additionally patterning the substrate 100 in the second region RG2 to cause the trenches to have greater depths in the second region RG2. Consequently, the third trenches TR3 in the second region RG2 may be formed deeper than the first trenches TR1 in the first region RG1.

As another example, the first pattering process may include patterning the substrate 100 in the first region RG1 to form the first trenches TR1, and patterning the substrate 100 in the second region RG2 to form the third trenches TR3. In this case, the first and second regions RG1 and RG2 may be patterned separately from each other, and the third trenches TR3 in the second region RG2 may be formed deeper than the first trenches TR1 in the first region RG1.

Each of the preliminary active pattern PAP, the third active pattern AP3, and the fourth active pattern AP4 may be formed to have a linear or bar shape extending in a second direction D2.

A first device isolation layer ST1 may be formed to fill the first and third trenches TR1 and TR3. The forming of the first device isolation layer ST1 may include forming a dielectric layer on the entire surface of the substrate 100, and recessing the dielectric layer until top surfaces of the preliminary active and channel patterns PAP and PCH are exposed.

Figure 5A:
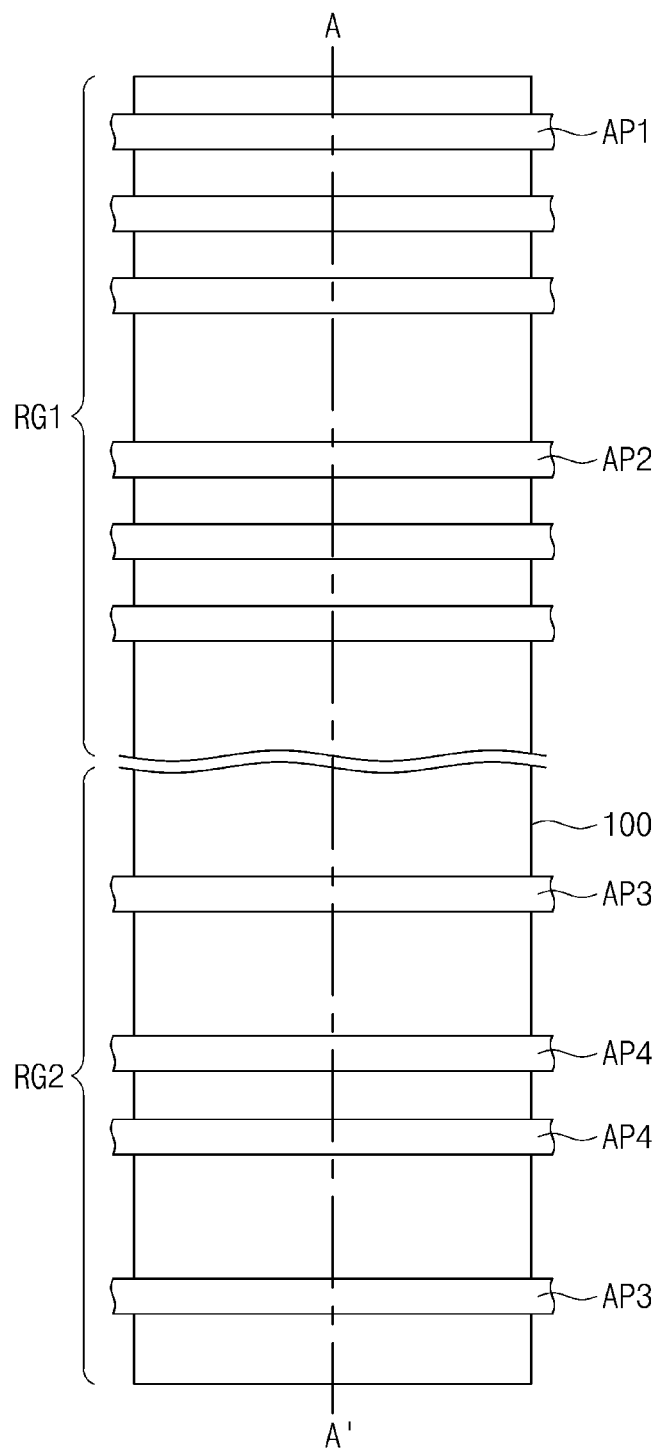
Figure 5B:
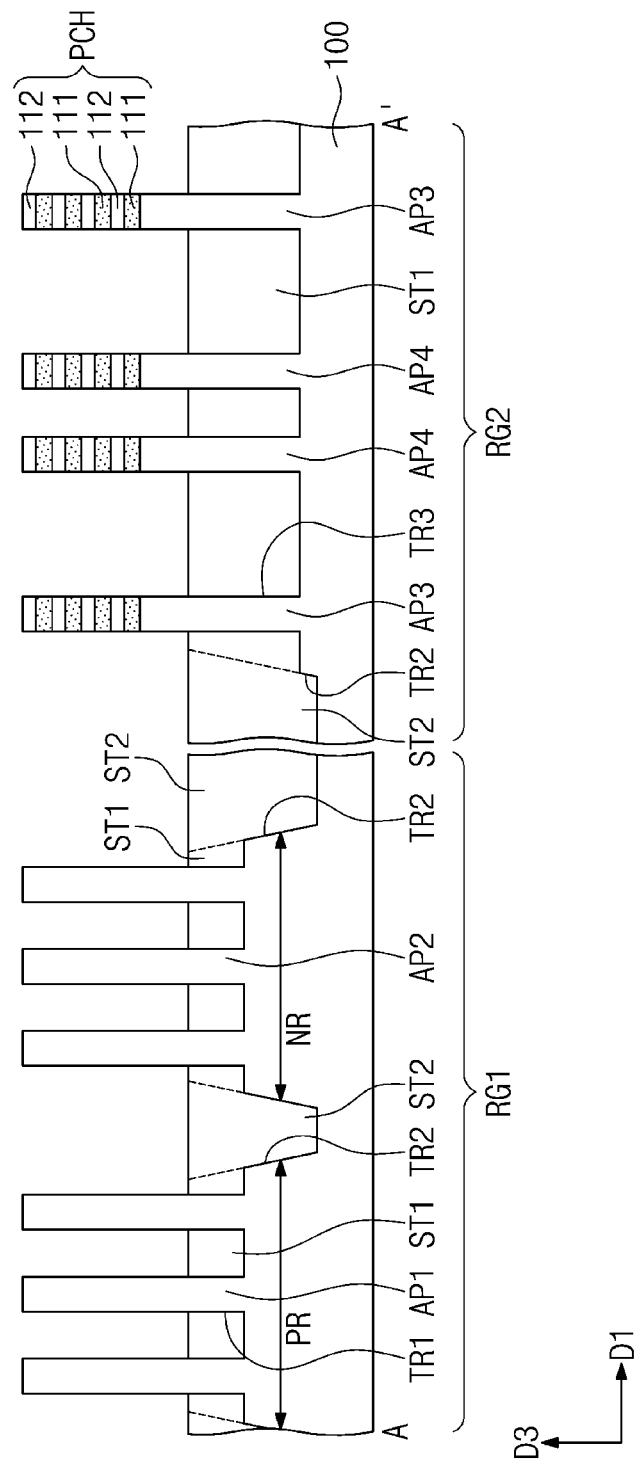
Figure 6A:
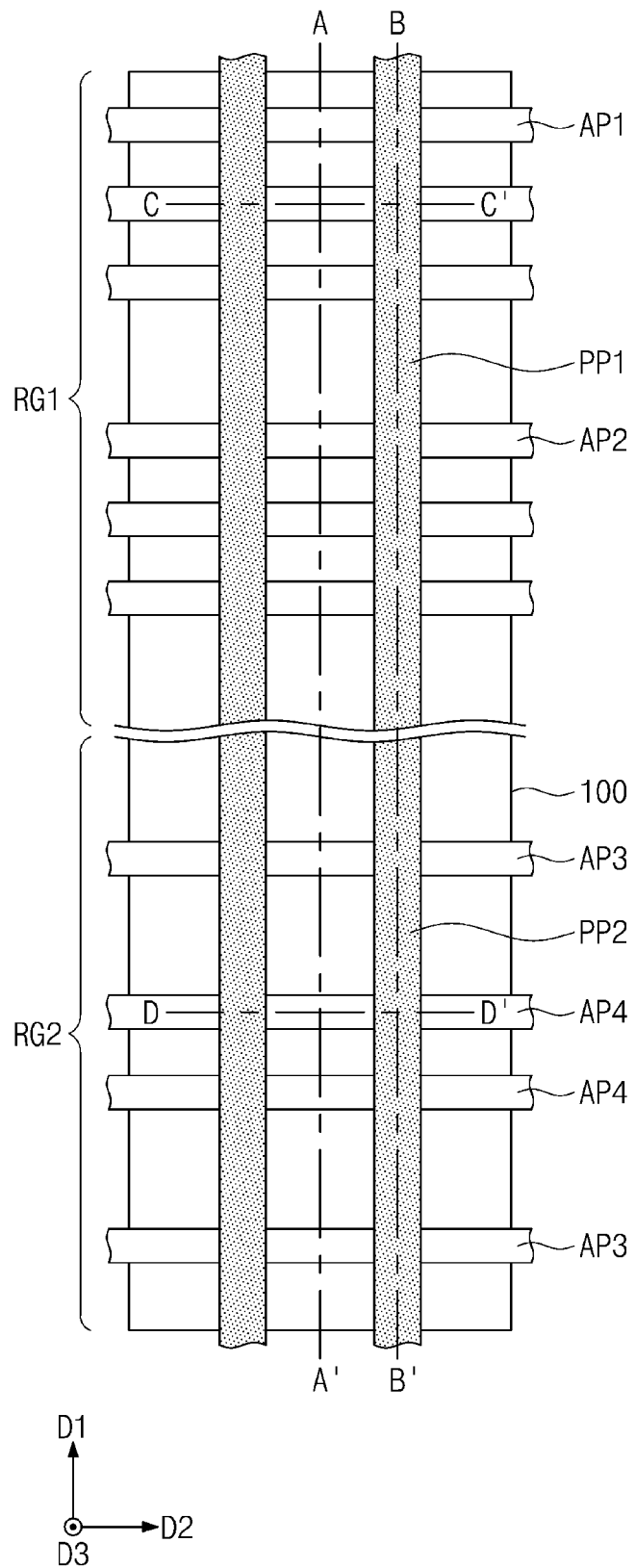
Figure 6B:
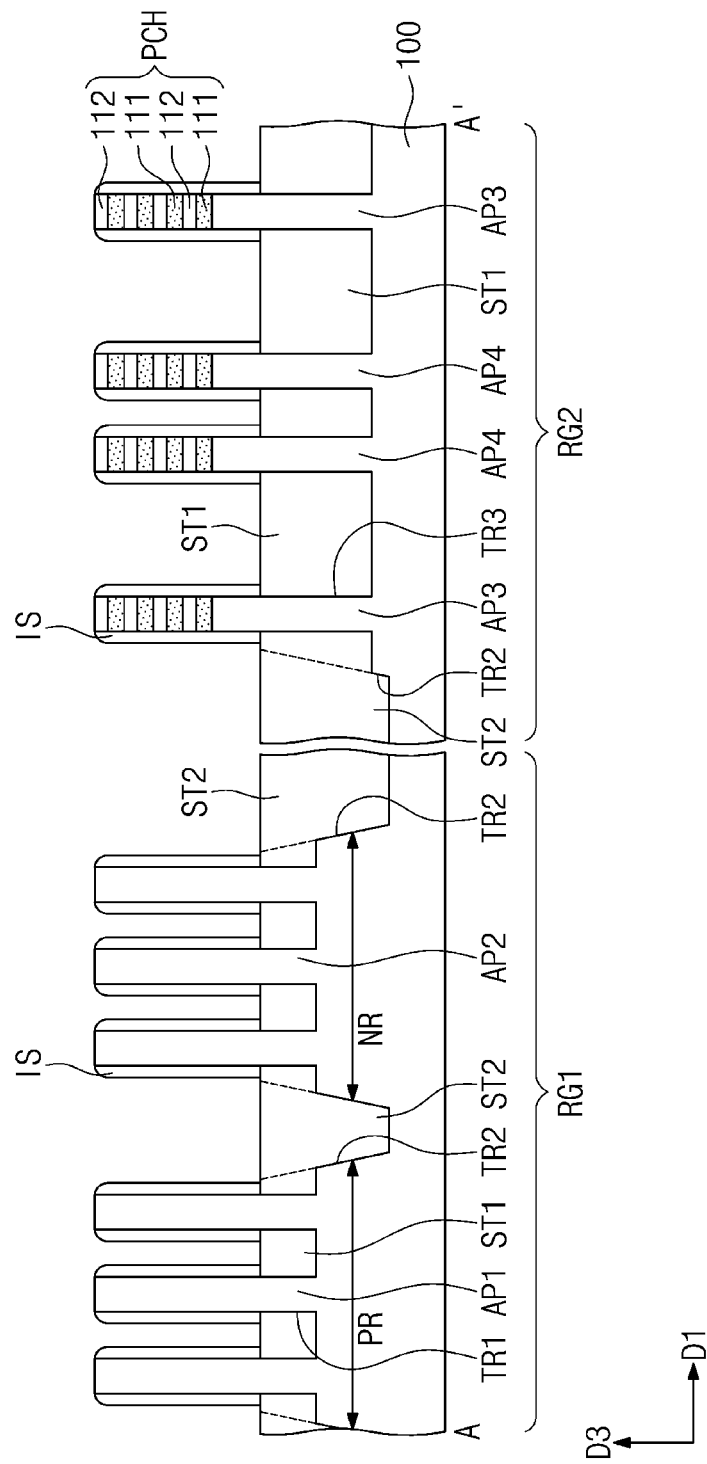
Figure 6C:
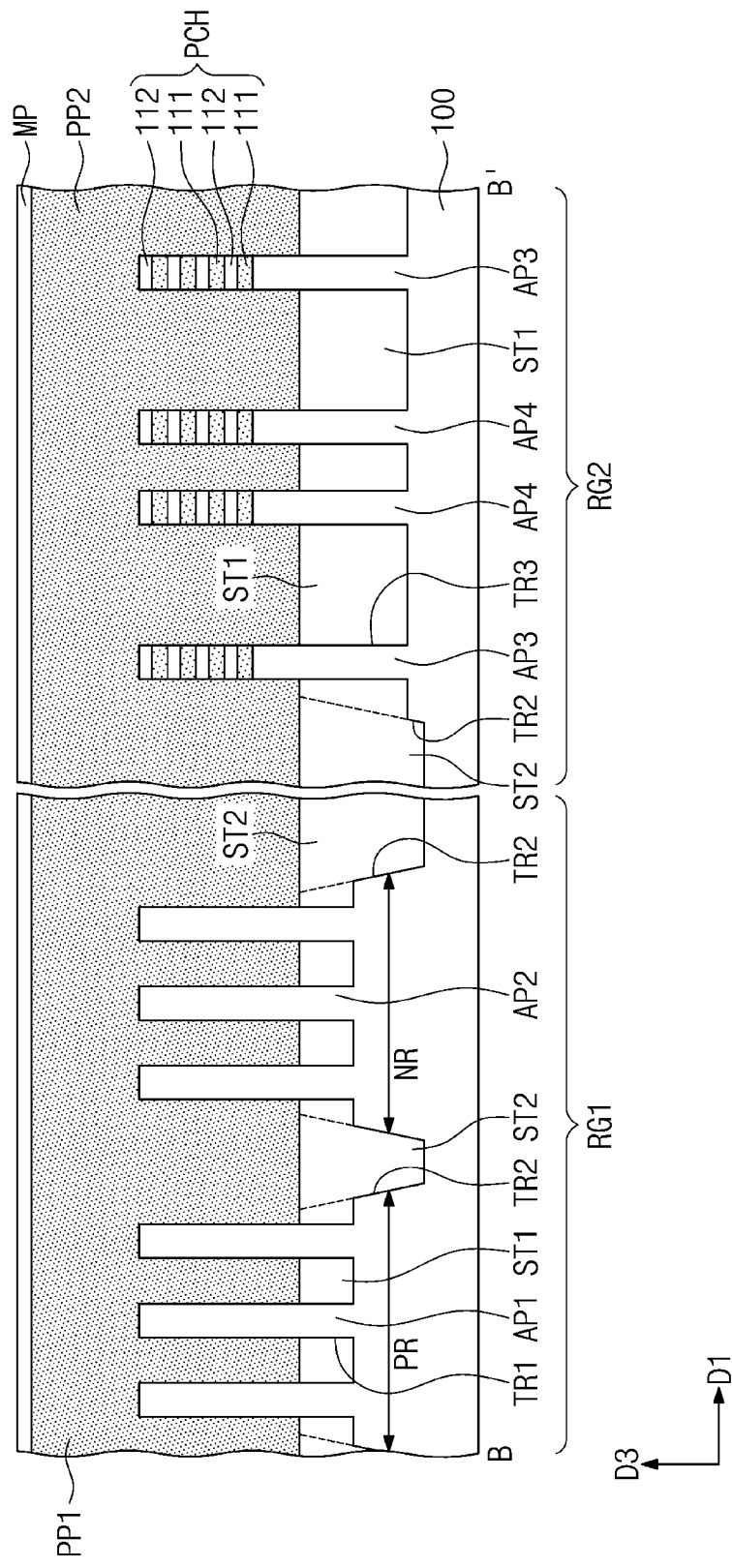
FIGS. 6C, 7C and 8C are cross-sectional views of the semiconductor device during the course of its manufacture taken along lines B-B' of FIGS. 6A, 7A and 8A, respectively.
Figure 6D:
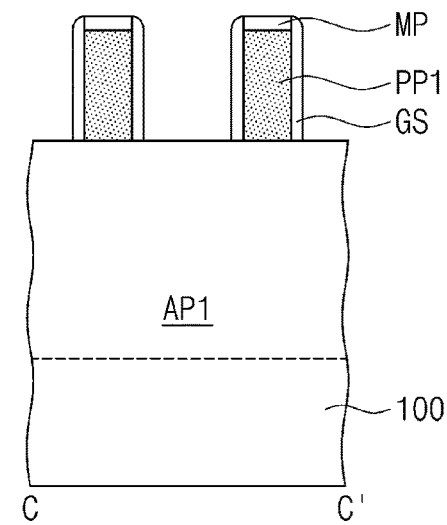
FIGS. 6D, 7D and 8D are cross-sectional views of the semiconductor device during the course of its manufacture taken along lines C-C' of FIGS. 6A, 7A and 8A, respectively.
Figure 6E:
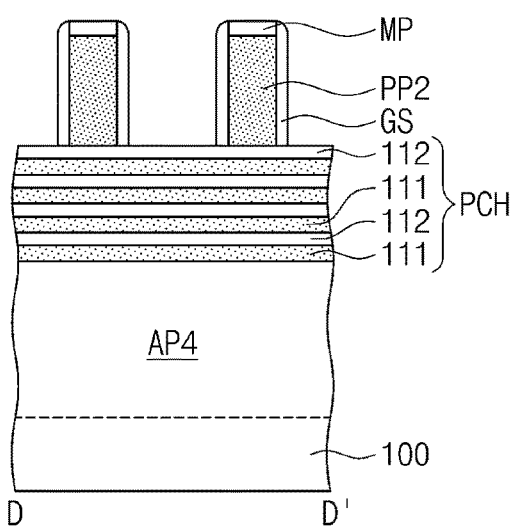
FIGS. 6E, 7E and 8E are cross-sectional views of the semiconductor device during the course of its manufacture taken along lines D-D' of FIGS. 6A, 7A and 8A, respectively
Figure 7A:
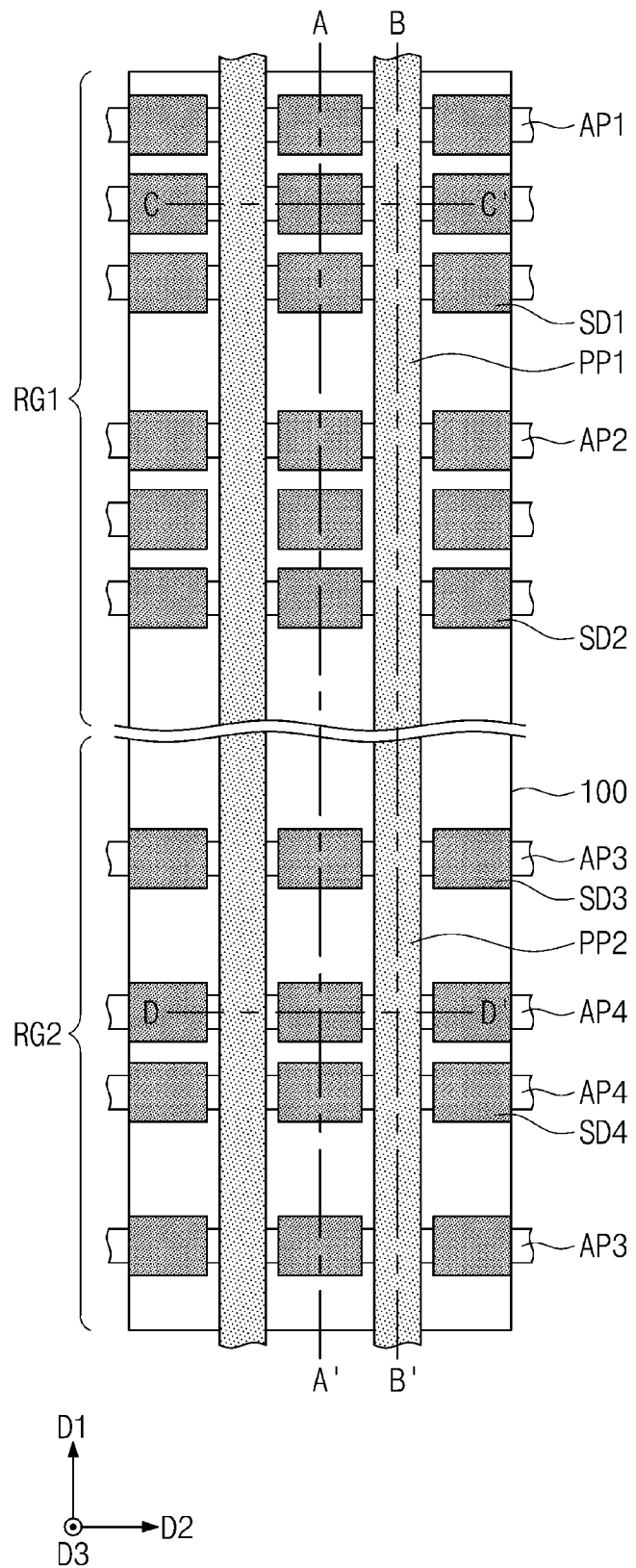
Figure 7B:
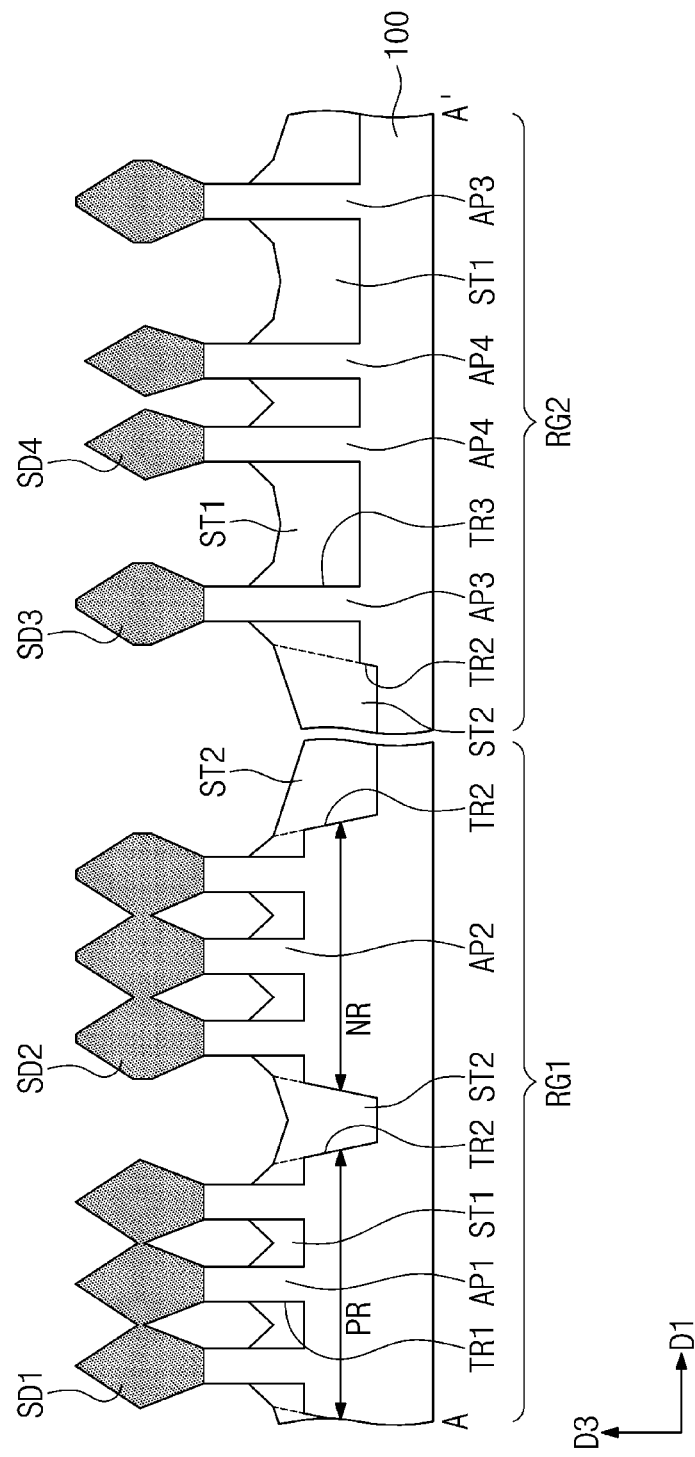
Figure 7C:
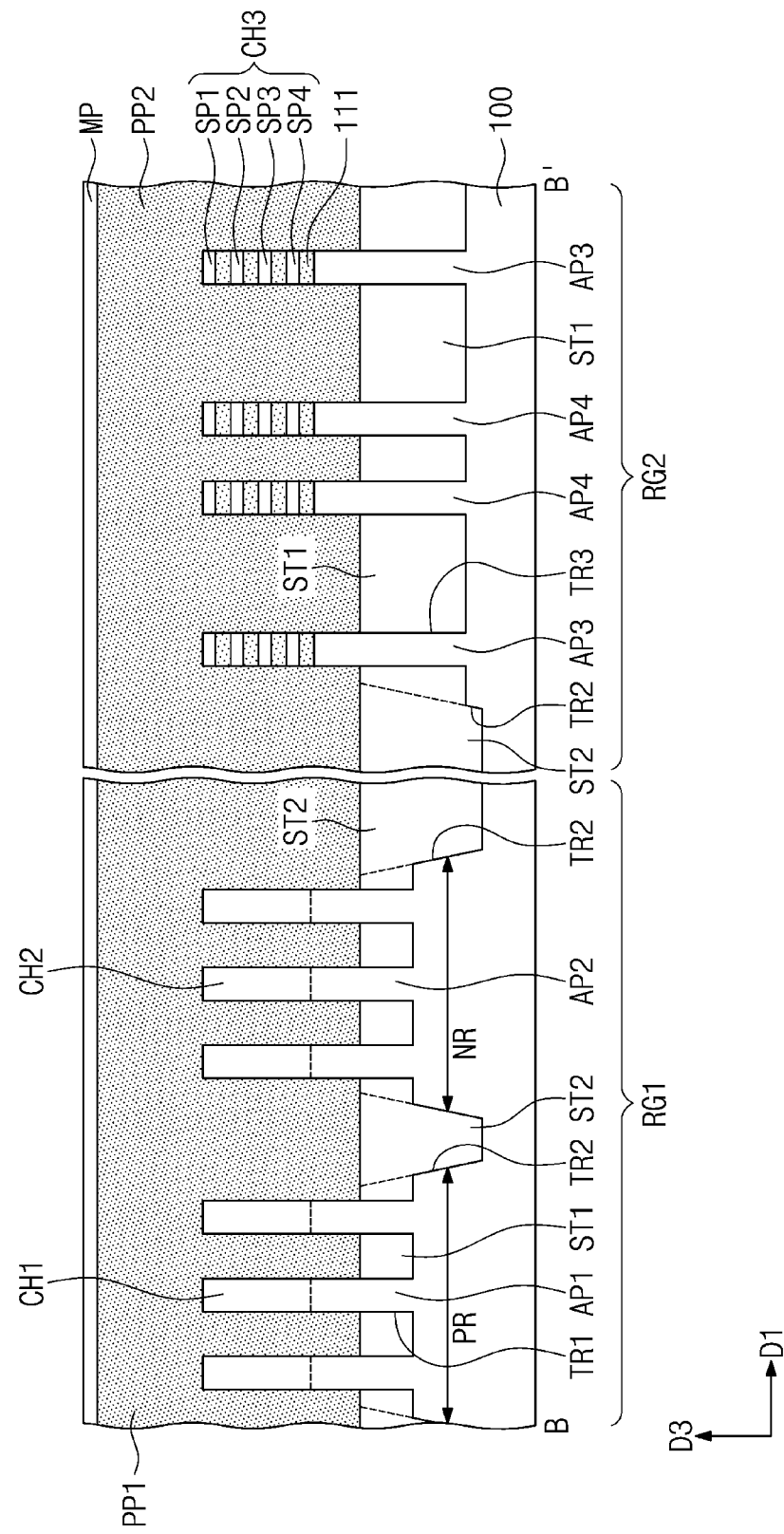
Figure 7D:
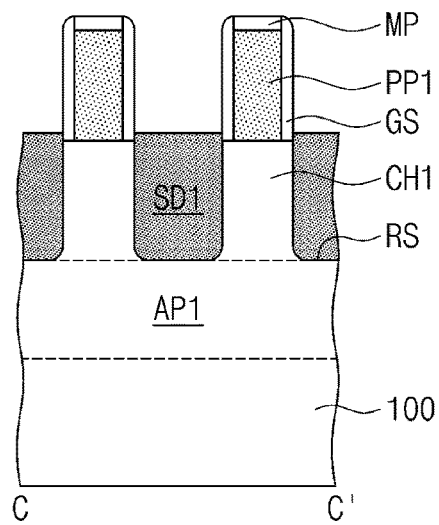
Figure 7E:
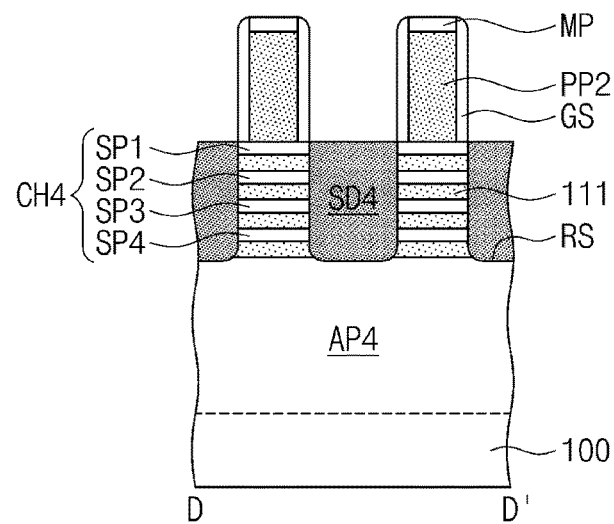
Figure 8A:
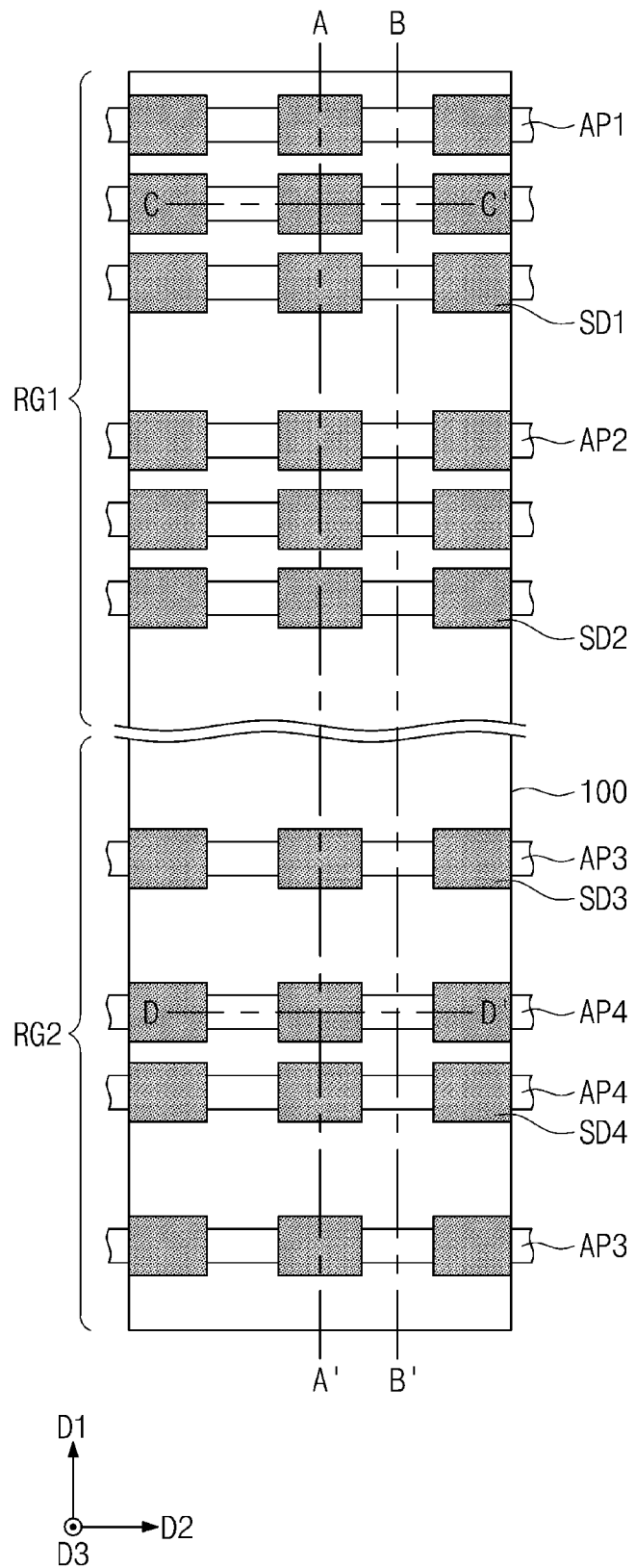
Figure 8B:
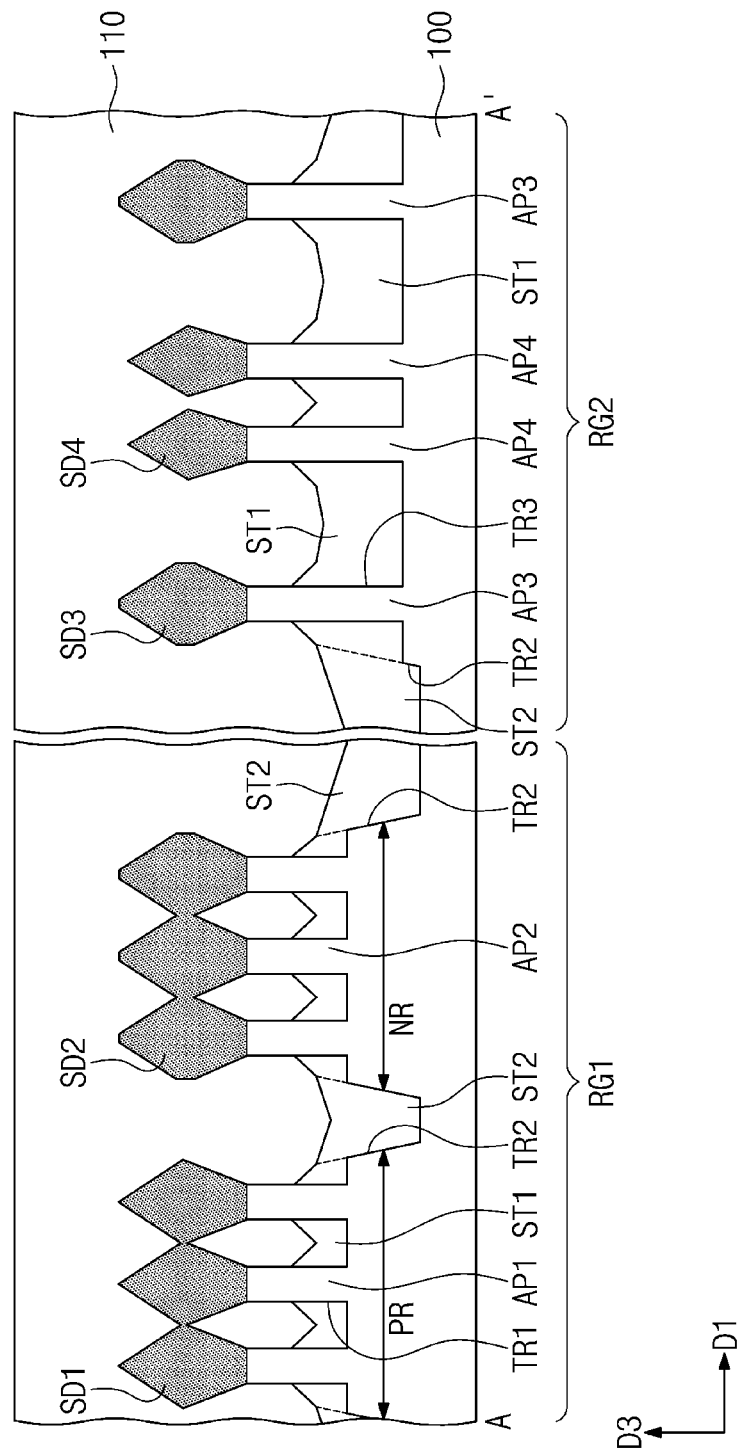
Figure 8C:
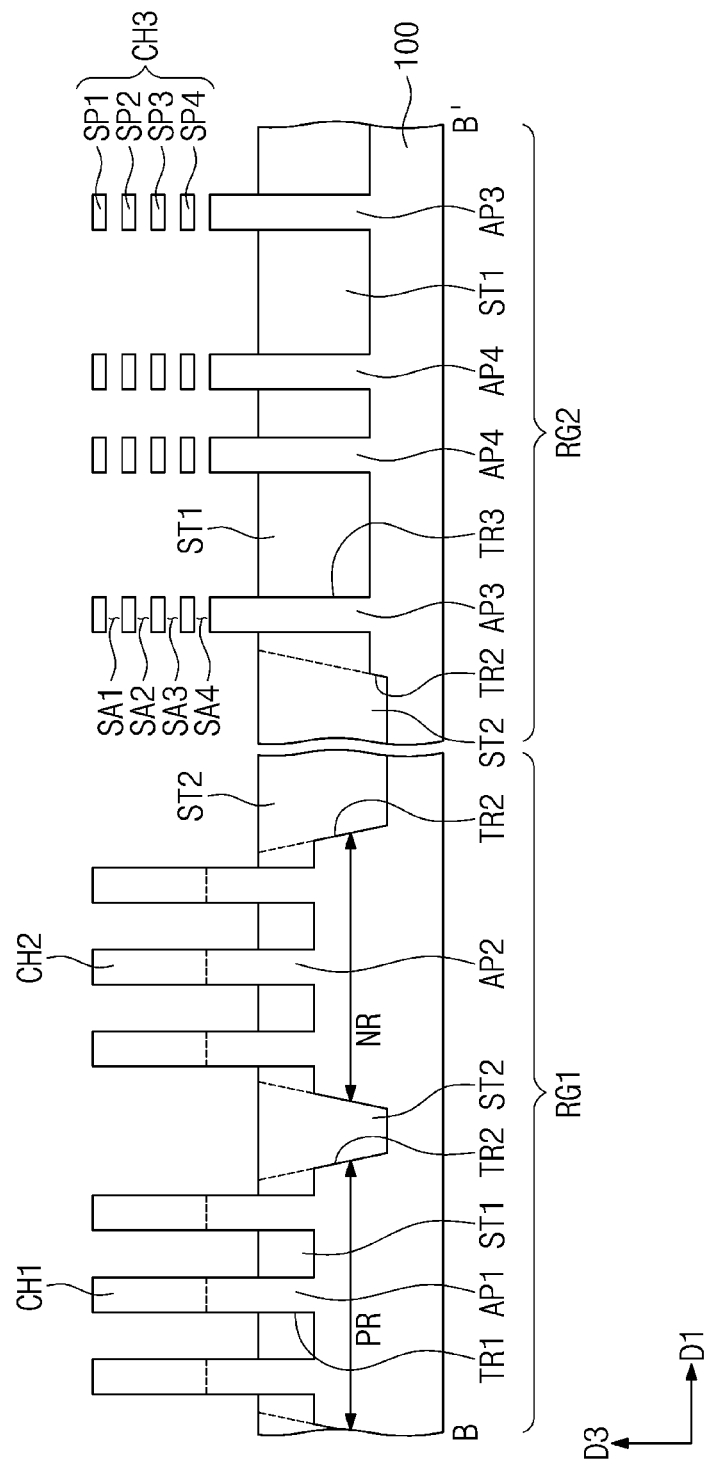
Figure 8D:
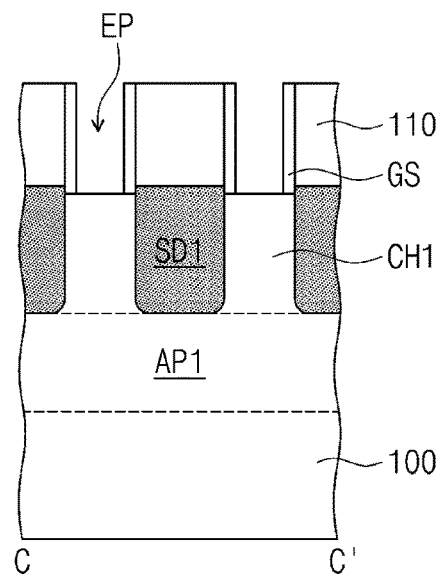
Figure 8E:
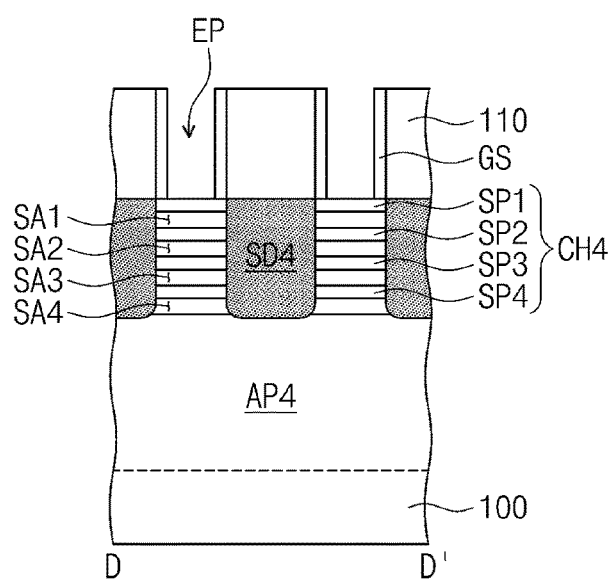
Figure 9A:
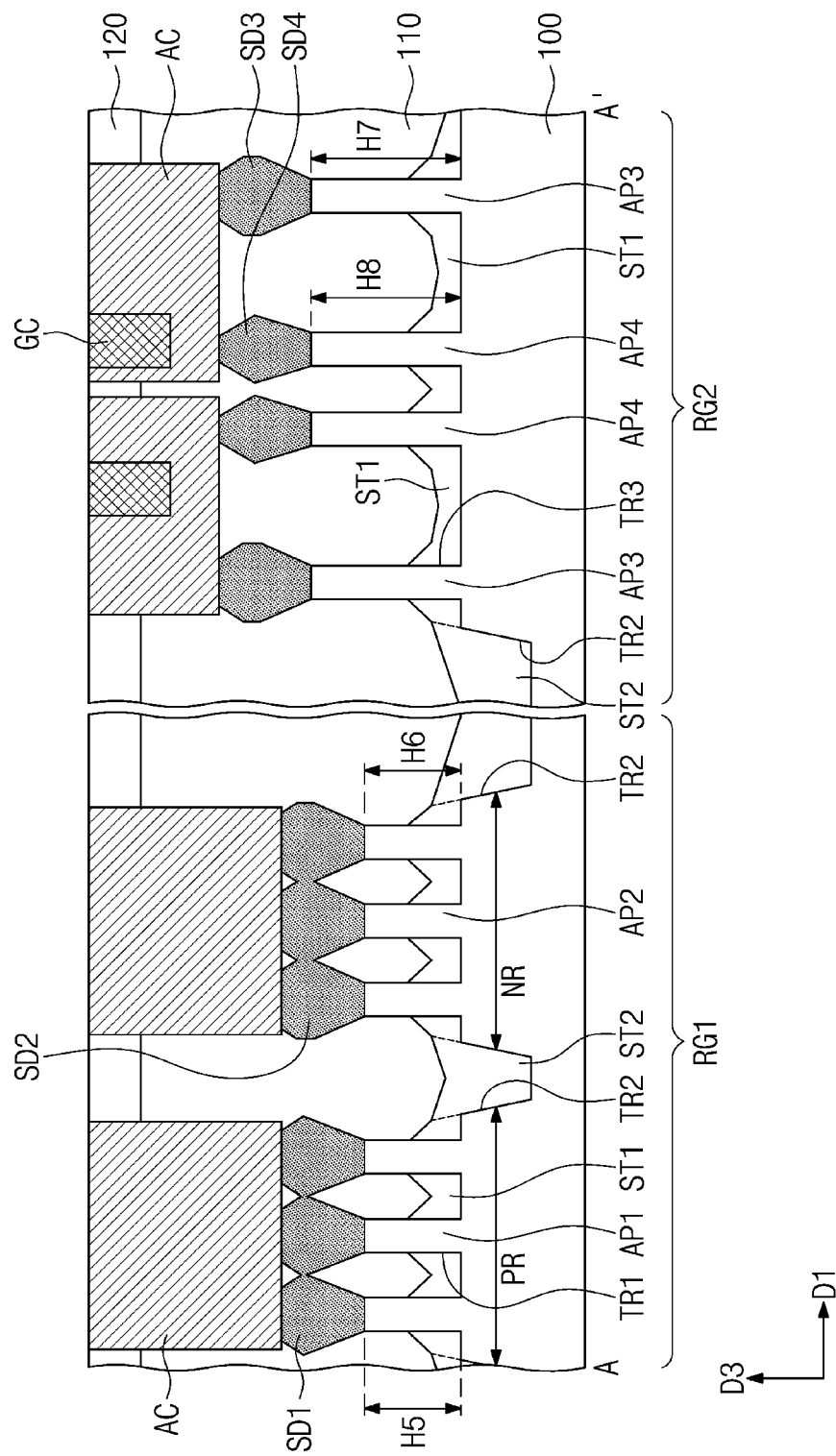
FIGS. 9A, 9B, 9C and 9D are cross-sectional views of an example of a semiconductor device having the layout shown in FIG. 1A according to the present inventive concepts, and respectively taken in directions corresponding to those of lines A-A', B-B', C-C', and D-D' of FIG. 1A.
Figure 9B:
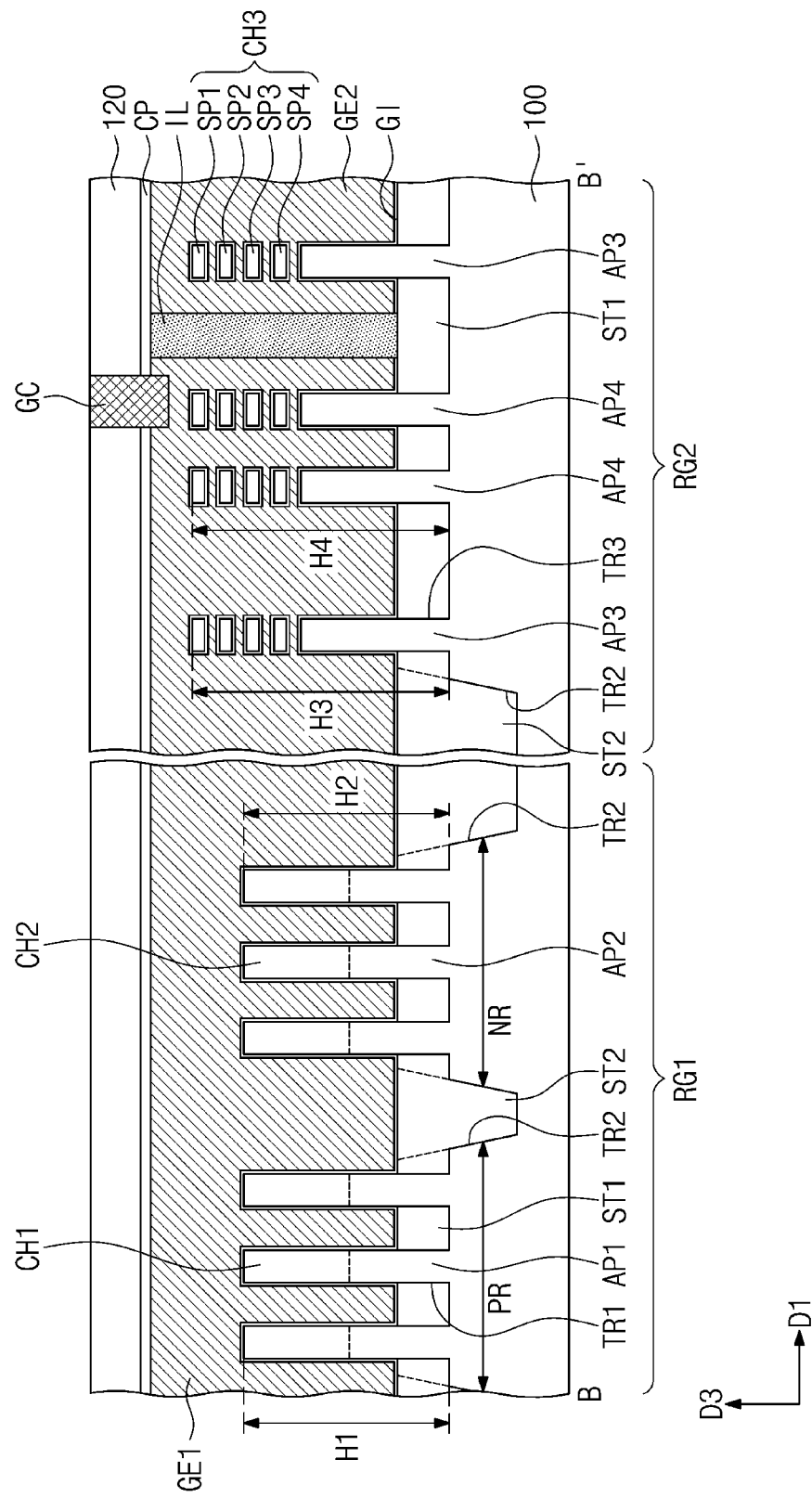
Figure 9C:
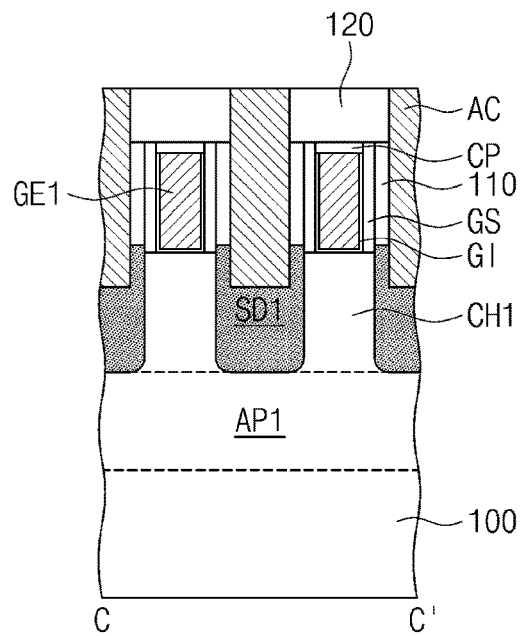
Figure 9D:
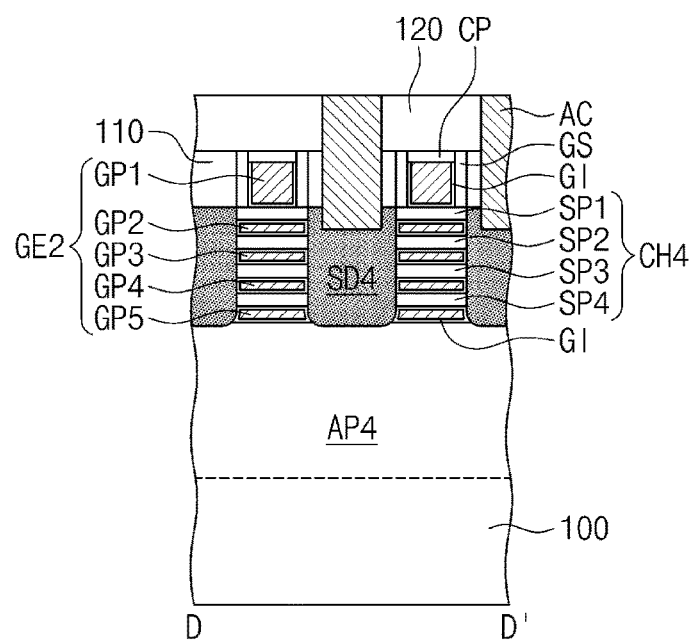

Referring to FIGS. 5A and 5B, a second patterning process may be performed to pattern the preliminary active patterns PAP, the first device isolation layer ST1, and the substrate 100.

The second patterning process may form second trenches TR2. The second trenches TR2 may be formed deeper than the first and third trenches TR1 and TR3. The second trenches TR2 may define a PMOSFET section PR and an NMOSFET section NR in the first region RG1. The second patterning process may be performed such that respective ones of the preliminary active patterns PAP are removed to leave first active patterns AP1 on the PMOSFET section PR and also to leave second active patterns AP2 on the NMOSFET section NR. The second patterning process may remove a portion of the first device isolation layer ST1.

A second device isolation layer ST2 may be formed to fill the second trenches TR2. The forming of the second device isolation layer ST2 may include forming a dielectric layer on the entire surface of the substrate 100. Afterwards, the first and second device isolation layers ST1 and ST2 may be recessed. When the first and second device isolation layers ST1 and ST2 are recessed, the first and second device isolation layers ST1 and ST2 may expose upper portions of the first and second active patterns AP1 and AP2, and also expose the preliminary channel patterns PCH of the third and fourth active patterns AP3 and AP4.

Referring to FIGS. 6A-6E, first sacrificial patterns PP1 may be formed to run across the first and second active patterns AP1 and AP2 of the substrate 100 in the first region RG1. Second sacrificial patterns PP2 may be formed to run across the third and fourth active patterns AP3 and AP4 of the substrate 100 in the second region RG2. Each of the first and second sacrificial patterns PP1 and PP2 may be formed to have a linear or bar shape extending in a first direction D1.

The forming of the first and second sacrificial patterns PP1 and PP2 may include forming a sacrificial layer on the substrate 100, forming mask patterns MP on the sacrificial layer, and using the mask patterns MP as an etching mask to etch the sacrificial layer. The sacrificial layer may be formed of polysilicon. The mask patterns MP may be formed of a silicon oxide layer, a silicon nitride layer, or a silicon oxynitride layer.

A respective pair of gate spacers GS may be formed on opposite sides of each of the first and second sacrificial patterns PP1 and PP2. A respective pair of dielectric spacers IS may be formed on opposite sides of each of the first to fourth active patterns AP1 to AP4. The gate spacers GS and the dielectric spacers IS may be formed at the same time. The gate spacers GS and the dielectric spacers IS may be formed of the same material. For example, the gate spacers GS and the dielectric spacers IS may be formed of one or more of SiCN, SiCON, and SiN.

The forming of the gate spacers GS and the dielectric spacers IS may include performing a deposition process, such as CVD or ALD, to form a spacer layer on the entire surface of the substrate 100, and performing an anisotropic etching process on the spacer layer.

Referring to FIGS. 7A to 7E, the mask patterns MP and the gate spacers GS may be used as an etching mask to etch the first to fourth active patterns AP1 to AP4, with the result that recesses RS are formed. The recesses RS may be formed in each of the first to fourth active patterns AP1 to AP4. The dielectric spacers IS may be removed while the recesses RS are formed. The recesses RS may define first channels CH1 on an upper portion of each of the first active patterns AP1, second channels CH2 on an upper portion of each of the second active patterns AP2, third channels CH3 on an upper portion of each of the third active patterns AP3, and fourth channels CH4 on an upper portion of each of the fourth active patterns AP4. Each of the third and fourth channels CH3 and CH4 may include first to fourth semiconductor patterns SP1 to SP4. The first to fourth semiconductor patterns SP1 to SP4 may be formed when the first semiconductor layers 112 are etched. The sacrificial layers 111 may be provided between the first to fourth semiconductor patterns SP1 to SP4.

First to fourth source/drain patterns SD1 to SD4 may be formed to fill the recesses RS. The first source/drain patterns SD1 may be formed on the first active patterns AP1, the second source/drain patterns SD2 may be formed on the second active patterns AP2, the third source/drain patterns SD3 may be formed on the third active patterns AP3, and the fourth source/drain patterns SD4 may be formed on the fourth active patterns AP4. A selective epitaxial growth process may be performed to form the first to fourth source/drain patterns SD1 to SD4. For example, the selective epitaxial growth process may include chemical vapor deposition (CVD) or molecular beam epitaxy (MBE). Simultaneously with or after the selective epitaxial growth process, the first and fourth source/drain patterns SD1 and SD4 may be doped with p-type impurities, and the second and third source/drain patterns SD3 and SD4 may be doped with n-type impurities.

The sizes of the third and fourth source/drain patterns SD3 and SD4 may be less than those of the first and second source/drain patterns SD1 and SD2. For example, the maximum heights of the third and fourth source/drain patterns SD3 and SD4 may be less than those of the first and second source/drain patterns SD1 and SD2. The maximum height of each of the first to fourth source/drain patterns SD1 to SD4 may be the shortest distance between the bottoms and the top surfaces of each of the first to fourth source/drain patterns SD1 to SD4, respectively.

Referring to FIGS. 8A to 8E, a first interlayer dielectric layer 110 may be formed on the entire surface of the substrate 100. A planarization process may be performed on the first interlayer dielectric layer 110 until top surfaces of the first and second sacrificial patterns PP1 and PP2 are exposed. The planarization process may include an etch-back process and/or a chemical mechanical polishing (CMP) process. When the first interlayer dielectric layer 110 is planarized, the mask patterns MP may also be removed. The first interlayer dielectric layer 110 may be formed of, for example, a silicon oxide layer or a silicon oxynitride layer.

A removal process may be performed to selectively remove the first and second sacrificial patterns PP1 and PP2 exposed by the planarization process. The removal of the first and second sacrificial patterns PP1 and PP2 may form an empty space EP between a pair of neighboring gate spacers GS. The empty spaces EP may expose the sacrificial layers 111 and the first to fourth channels CH1 to CH4.

A removal process may be performed to selectively remove the sacrificial layers 111 on the second region RG2 that are exposed to the empty spaces EP. The removal of the sacrificial layers 111 may partially expose opposite lateral surfaces of each of the third and fourth source/drain patterns SD3 and SD4. First to fourth cavities SA1 to SA4 may be formed when the sacrificial layers 111 are removed. The first to fourth cavities SA1 to SA4 may be spatially connected to, i.e., open to the empty spaces EP, and may thus expose top and bottom surfaces and opposite sides of each of the first to fourth semiconductor patterns SP1 to SP4 on the second region RG2.

The first cavity SA1 may be defined between the first semiconductor pattern SP1 and the second semiconductor pattern SP2, the second cavity SA2 may be defined between the second semiconductor pattern SP2 and the third semiconductor pattern SP3, the third cavity SA3 may be defined between the third semiconductor pattern SP3 and the fourth semiconductor pattern SP4, and the fourth cavity SA4 may be defined either between the fourth semiconductor pattern SP4 and the third active pattern AP3 or between the fourth semiconductor pattern SP4 and the fourth active pattern AP4.

Referring back to FIGS. 1A to 1E, a gate dielectric pattern GI and a first gate electrode GE1 may be formed in each of the empty spaces EP, and a gate dielectric pattern GI and a second gate electrode GE2 may be formed in the first to fourth cavities SA1 to SA4. The forming of the gate dielectric pattern GI and the first and second gate electrodes GE1 and GE2 may include conformally forming a gate dielectric layer in the empty space EP and in the first to fourth cavities SA1 to SA4, and forming a gate electrode layer to completely fill the empty space EP and the first to fourth cavities SA1 to SA4. The filling of the first to fourth cavities SA1 to SA4 with the gate electrode layer may form second to fifth segments GP2 to GP5 of the second gate electrode GE2. The filling of the empty space EP with the gate electrode layer may form the first gate electrode GE1 and a first segment GP1 of the second gate electrode GE2. The gate dielectric layer may include high-k dielectric material. The gate electrode layer may include one or more materials selected from the group consisting of metal nitrides and metals.

Gate capping patterns GP may be formed on the first and second gate electrodes GE1 and GE2. The gate capping patterns CP may include one or more of SiON, SiCN, SiCON, and SiN. A second interlayer dielectric layer 120 may be formed on the first interlayer dielectric layer 110 and the gate capping patterns CP.

Active contacts AC may be formed through the first and second interlayer dielectric layers 110 and 120 to connect with the first to fourth source/drain patterns SD1 to SD4. Gate contacts GC may be formed on the substrate 100 through the second interlayer dielectric layer 120 and the gate capping patterns CP in the second region RG2 to connect with the second gate electrodes GE2. The forming of the active contacts AC and the gate contacts GC may include forming holes in the relevant interlayer dielectric layers and forming a conductive layer to fill the holes. The conductive layer may include one or more materials selected from the group consisting of metals and metal nitrides.

FIGS. 1A and 9A to 9D illustrate another example of a semiconductor device according to the present inventive concepts. In the description that follows, technical features of this example similar to those discussed above with reference to the example of FIGS. 1A to 1E will be omitted, and mainly on the differences therebetween will be discussed in detail.

Referring to FIGS. 1A and 9A to 9D, the bottom of the third trench TR3 may be located at substantially the same level as that of the bottom of the first trench TR1. The bottom of the second trench TR2 may be located at a level lower than that of the bottoms of the first and third trenches TR1 and TR3.

The first active pattern AP1 may have a first height H1 as its maximum height. The first height H1 may be the shortest distance from the bottom of the first trench TR1 to the top surface of the first channel CH1. The second active pattern AP2 may have a second height H2 as its maximum height. The second height H2 may be the shortest distance from the bottom of the first trench TR1 to the top surface of the second channel CH2. The third active pattern AP3 may have a third height H3 as its maximum height. The third height H3 may be the shortest distance from the bottom of the third trench TR3 to the top surface of the first semiconductor pattern SP1 of the third channel CH3. The fourth active pattern AP4 may have a fourth height H4 as its maximum height. The fourth height H4 may be the shortest distance from the bottom of the third trench TR3 to the top surface of the first semiconductor pattern SP1 of the fourth channel CH4.

The first and second heights H1 and H2 may be substantially the same, and the third and fourth heights H3 and H4 may be substantially the same. The third and fourth heights H3 and H4 may be greater than the first and second heights H1 and H2.

The top surfaces of the first and second channels CH1 and CH2 may be located at a level lower than that of the top surface of the first semiconductor pattern SP1 of each of the third and fourth channels CH3 and CH4.

A portion of the first active pattern AP1 beneath the first source/drain pattern SD1 may have a fifth height H5. The fifth height H5 may be the shortest distance from the bottom of the first trench TR1 to the bottom of the first source/drain pattern SD1. A portion of the second active pattern AP2 beneath the second source/drain pattern SD2 may have a sixth height H6. The sixth height H6 may be the shortest distance from the bottom of the first trench TR1 to the bottom of the second source/drain pattern SD2. A portion of the third active pattern AP3 beneath the third source/drain pattern SD3 may have a seventh height H7. The seventh height H7 may be the shortest distance from the bottom of the third trench TR3 to the bottom of the third source/drain pattern SD3. A portion of the fourth active pattern AP4 beneath the fourth source/drain pattern SD4 may have an eighth height H8. The eighth height H8 may be the shortest distance from the bottom of the third trench TR3 to the bottom of the fourth source/drain pattern SD4.

The fifth and sixth heights H5 and H6 may be substantially the same, and the seventh and eighth heights H7 and H8 may be substantially the same. The seventh and eighth heights H7 and H8 may be greater than the fifth and sixth heights H5 and H6.

The bottom of each of the first and second source/drain patterns SD1 and SD2 may be located at a level lower than that of the bottom of each of the third and fourth source/drain patterns SD3 and SD4.

Figure 10A:
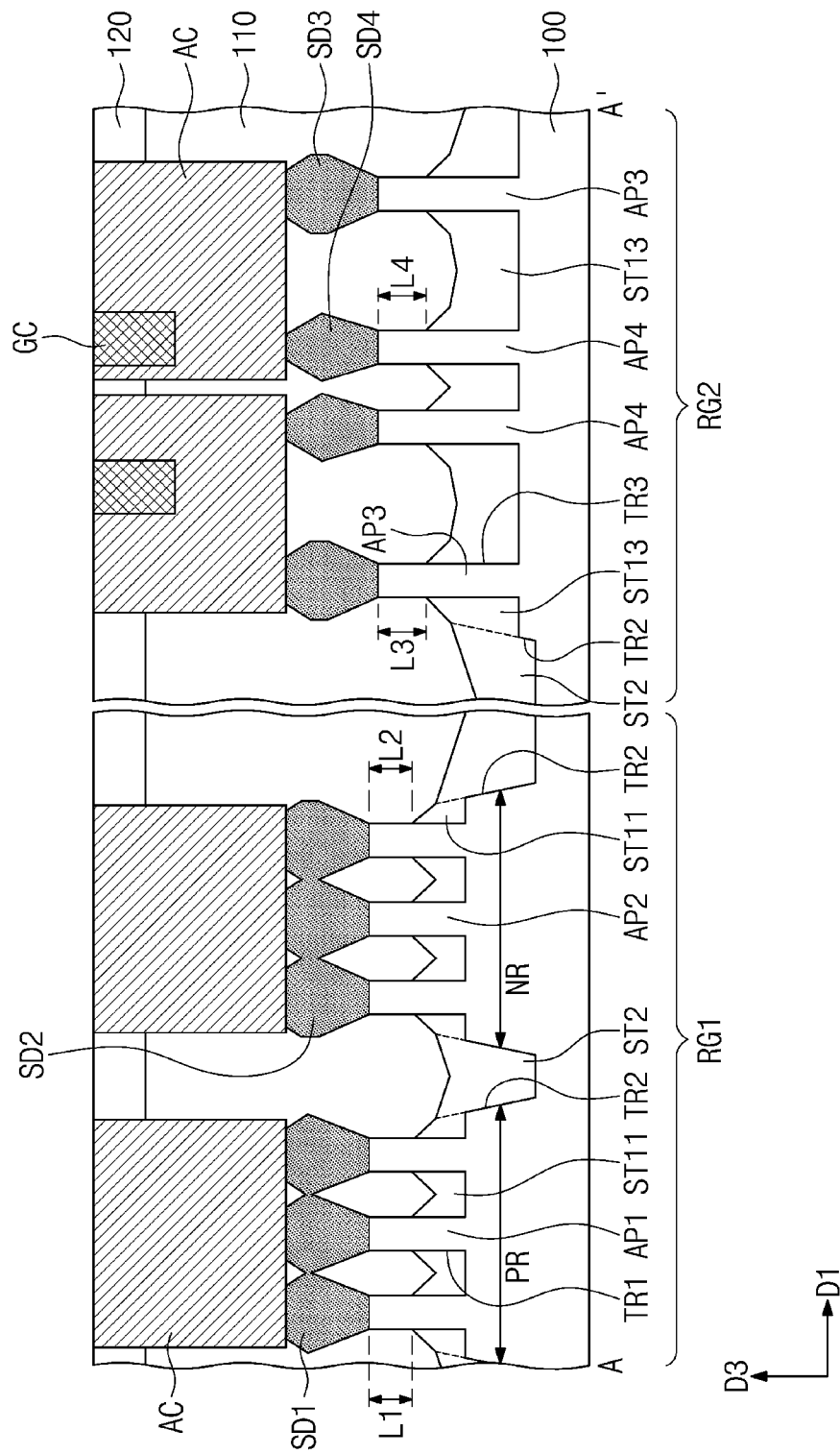
FIGS. 10A and 10B are cross-sectional views of an example of a semiconductor device having the layout shown in FIG. 1A according to the present inventive concepts, and respectively taken in directions corresponding to those of lines A-A' and B-B' of FIG. 1A.
Figure 10B:
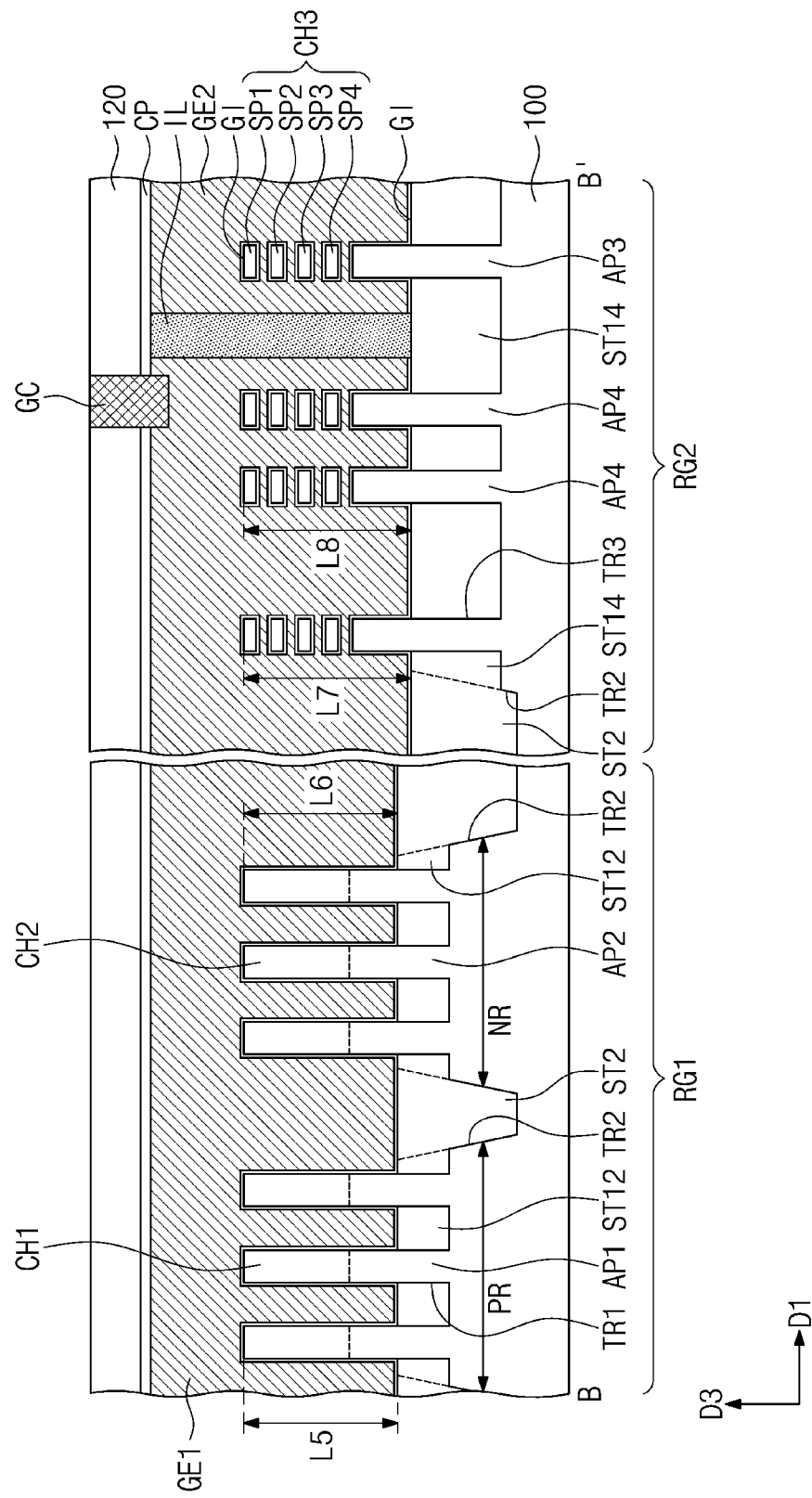

FIGS. 1, 10A and 10B illustrate another example of a semiconductor device according to the present inventive concepts. In the description that follows, technical features of this example similar to those discussed above with reference to the example of FIGS. 1A to 1E will be omitted, and mainly only the differences therebetween will be discussed in detail.

Referring to FIGS. 1A, 10A, and 10B, the first device isolation layer ST1 may include first and second segments ST11 and ST12 in first region RG1 and may also include third and fourth segments ST13 and ST14 in the second region RG2. The first segments ST11 may be disposed beneath the first and second source/drain patterns SD1 and SD2. The second segments ST12 may be disposed beneath the first gate electrodes GE1. The third segments ST13 may be disposed beneath the third and fourth source/drain patterns SD3 and SD4. The fourth segments ST14 may be disposed beneath the second gate electrodes GE2.

Top surfaces of the first segments ST11 may have their uppermost portions located at a level higher than that of uppermost portions of top surfaces of the third segments ST13. Top surfaces of the second segments ST12 may be located at a level higher than that of top surfaces of the fourth segments ST14. A first length L1 may refer to the shortest distance from the first source/drain pattern SD1 to the first segment ST11 of the first device isolation layer ST1. A second length L2 may refer to the shortest distance from the second source/drain pattern SD2 to the first segment ST11 of the first device isolation layer ST1. A third length L3 may refer to the shortest distance from the third source/drain pattern SD3 to the third segment ST13 of the first device isolation layer ST1. A fourth length L4 may refer to the shortest distance from the fourth source/drain pattern SD4 to the third segment ST13 of the first device isolation layer ST1.

The first and second lengths L1 and L2 may be substantially the same, and the third and fourth lengths L3 and L4 may be substantially the same. The third and fourth lengths L3 and L4 may be greater than the first and second lengths L1 and L2.

A fifth length L5 may refer to the shortest distance from the second segment ST12 of the first device isolation layer ST1 to the top surface of the first channel CH1. A sixth length L6 may refer to the shortest distance from the second segment ST12 of the first device isolation layer ST1 to the top surface of the second channel CH2. A seventh length L7 may refer to the shortest distance from the fourth segment ST14 of the first device isolation layer ST1 to the top surface of the first semiconductor pattern SP1 of the third channel CH3. An eighth length L8 may refer to the shortest distance from the fourth segment ST14 of the first device isolation layer ST1 to the top surface of the first semiconductor pattern SP1 of the fourth channel CH4.

The fifth and sixth lengths L5 and L6 may be substantially the same, and the seventh and eighth lengths L7 and L8 may be substantially the same. The seventh and eighth lengths L7 and L8 may be greater than the fifth and sixth lengths L5 and L6.

According to an aspect of the present inventive concepts as is clear from the description above, a semiconductor device may include gate-all-around types of transistors in a memory cell region but not in a logic region of the device, and thus may have improved electrical characteristics. The transistors in the logic region may be finFETs.

Although various examples of the present inventive concepts have been described above with reference to accompanying figures, various changes in form and details thereto in accordance with the present inventive concepts will be readily apparent to those of ordinary skill in the art. It therefore will be understood that the examples described above are illustrative but not limitative of the true spirit and scope of the invention as defined by the appended claims.

What is claimed is:
1. A semiconductor device, comprising:
   a substrate having a plurality of first active patterns, a plurality of second active patterns, a plurality of third active patterns, and a plurality of fourth active patterns, the plurality of first active patterns being located in a PMOSFET section of a logic cell region of the semiconductor device, the plurality of second active patterns being located in an NMOSFET section of the logic cell region, the plurality of third active patterns being located in a memory cell region of the semiconductor device, and the plurality of fourth active patterns being located in between respective ones of the third active patterns, and the substrate defining a plurality of logic region trenches and a plurality of memory cell region trenches, the logic region trenches being located between adjacent ones of the first active patterns and between adjacent ones of the second active patterns, respectively, and the memory cell region trenches being located between adjacent ones of the fourth active patterns and between said respective ones of the third active patterns and the fourth active patterns adjacent thereto, respectively; and a device isolation layer disposed in the plurality of logic region trenches and in the plurality of memory cell region trenches, wherein the memory cell region trenches are deeper than the logic region trenches.

2. The semiconductor device of claim 1, wherein maximum heights of the third and fourth active patterns are greater than maximum heights of the first and second active patterns.

3. The semiconductor device of claim 1, further comprising:

a plurality of first source/drain patterns on the plurality of first active patterns;

a plurality of second source/drain patterns on the plurality of second active patterns;

a plurality of third source/drain patterns on the plurality of third active patterns; and a plurality of fourth source/drain patterns on the plurality of fourth active patterns, wherein the second and third source/drain patterns are n-type impurity regions, and the first and fourth source/drain patterns are p-type impurity regions.

4. The semiconductor device of claim 3, wherein a maximum height of each of the third and fourth source/drain patterns is less than a maximum height of each of the first and second source/drain patterns.

5. The semiconductor device of claim 3, wherein each of the third and fourth active patterns includes first and second semiconductor patterns that are vertically spaced apart from each other, the first and second semiconductor patterns connect the third source/drain patterns to each other, and connect the fourth source/drain patterns to each other.

6. The semiconductor device of claim 5, wherein the first and second semiconductor patterns have the same thickness.

7. The semiconductor device of claim 1, further comprising:

a first gate electrode that runs across both of the first and second active patterns; and a second gate electrode that runs across both of the third and fourth active patterns, wherein the device isolation layer includes a first portion disposed in the logic region trenches and a second portion disposed in the memory cell region trenches, and wherein a first distance between a bottom surface of the first portion of the device isolation layer and a top surface of the first gate electrode is less than a second distance between a bottom surface of the second portion of the device isolation layer and a top surface of the second gate electrode.

8. A semiconductor device, comprising:

a substrate having a plurality of first active patterns, a plurality of second active patterns, a plurality of third active patterns, and a plurality of fourth active patterns, the plurality of first active patterns being located in a PMOSFET section of a first region of the semiconductor device, the plurality of second active patterns being located in an NMOSFET section of the first region, the plurality of third active patterns being located in a second region of the semiconductor device disposed laterally of the first region, and the plurality of fourth active patterns being located in between respective ones of the third active patterns, and the substrate defining a plurality of first region trenches and a plurality of second region trenches, the first region trenches being located between adjacent ones of the first active patterns and between adjacent ones of the second active patterns, respectively, and the second region trenches being located between adjacent ones of the fourth active patterns and between said respective ones of the third active patterns and the fourth active patterns adjacent thereto, respectively; and a first device isolation layer disposed in the plurality of first region trenches and in the plurality of second region trenches, wherein maximum heights of the third and fourth active patterns are greater than maximum heights of the first and second active patterns.

9. The semiconductor device of claim 8, wherein the first region trenches and the second region trenches extend to substantially the same depths in the substrate.

10. The semiconductor device of claim 8, wherein the substrate defines a second first region trench between the plurality of first active patterns and the plurality of second active patterns, and further comprising a second device isolation layer disposed in the second first region trench.

11. The semiconductor device of claim 10, wherein the second first region trench extends more deeply into the substrate than the first region trenches and the second region trenches.

12. The semiconductor device of claim 8, wherein each of the third and fourth active patterns includes first and second semiconductor patterns that are vertically spaced apart from each other.

13. The semiconductor device of claim 12, wherein each of the third and fourth active patterns further includes third and fourth semiconductor patterns, the first, second, third and fourth semiconductor patterns of each of the third and fourth active patterns being vertically spaced apart from each other.

14. The semiconductor device of claim 8, further comprising:

a first gate electrode that runs across both of the first and second active patterns; and a second gate electrode that runs across both of the third and fourth active patterns, wherein a first distance between a top surface of each of the first and second active patterns and a top surface of the first gate electrode is greater than a second distance between a top surface of each of the third and fourth active patterns and a top surface of the second gate electrode.

15. A semiconductor device, comprising:
a substrate having a plurality of first active patterns, a plurality of second active patterns, a plurality of third active patterns, and a plurality of fourth active patterns,
the plurality of first active patterns being located in a PMOSFET section of a first region of the semiconductor device,
the plurality of second active patterns being located in an NMOSFET section of the first region,
the plurality of third active patterns being located in a second region of the semiconductor device disposed laterally of the first region, and
the plurality of fourth active patterns being located in between respective ones of the third active patterns, and
the substrate defining a plurality of first region trenches and a plurality of second region trenches,
the first region trenches being located between adjacent ones of the first active patterns and between adjacent ones of the second active patterns, respectively, and
the second region trenches being located between adjacent ones of the fourth active patterns and between said respective ones of the third active patterns and the fourth active patterns adjacent thereto, respectively;
a first device isolation layer disposed in the plurality of first region trenches and in the plurality of second region trenches;
a first gate electrode that runs across both of the first and second active patterns; and
a second gate electrode that runs across both of the third and fourth active patterns,
wherein maximum height of the second gate electrode is greater than maximum height of the first gate electrode.

16. The semiconductor device of claim 15, wherein
a level of a bottom surface of the second gate electrode is lower than a level of a bottom surface of the first gate electrode.

17. The semiconductor device of claim 16, wherein
a first distance between a top surface of the first gate electrode and the bottom surface of the first gate electrode is less than a second distance between a top surface of the second gate electrode and the bottom surface of the second gate electrode.

18. The semiconductor device of claim 15, wherein
each of the third and fourth active patterns includes first, second, third and fourth semiconductor patterns that are vertically spaced apart from each other.

19. The semiconductor device of claim 18, further comprising:
a plurality of first source/drain patterns on the plurality of third active patterns; and
a plurality of second source/drain patterns on the plurality of fourth active patterns,
wherein the first source/drain patterns are p-type impurity regions, and
the second source/drain patterns are n-type impurity regions.

20. The semiconductor device of claim 19, wherein the first, second, third and fourth semiconductor patterns connect the first source/drain patterns to each other, and connect the second source/drain patterns to each other.

* * * * *